US012660493B2

(12) United States Patent
Ju et al.

(10) Patent No.: US 12,660,493 B2
(45) Date of Patent: Jun. 16, 2026

(54) DISPLAY PANEL AND REPAIR METHOD THEREOF

(71) Applicant: LG Display Co., Ltd., Seoul (KR)

(72) Inventors: Seong Hwan Ju, Paju-si (KR); Young Chor Cho, Paju-si (KR); Hyun Su Han, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/816,885

(22) Filed: Aug. 27, 2024

(65) Prior Publication Data

US 2025/0089546 A1 Mar. 13, 2025

(30) Foreign Application Priority Data

Sep. 11, 2023 (KR) ........................ 10-2023-0120515

(51) Int. Cl.
| | |
|---|---|
| H10K 71/00 | (2023.01) |
| G09G 3/00 | (2006.01) |
| G09G 3/3233 | (2016.01) |
| H10K 59/12 | (2023.01) |
| H10K 59/131 | (2023.01) |

(52) U.S. Cl.
CPC ........... H10K 71/861 (2023.02); G09G 3/006 (2013.01); G09G 3/3233 (2013.01); H10K 59/1201 (2023.02); H10K 59/131 (2023.02); *G09G 2300/0842* (2013.01); *G09G 2330/08* (2013.01); *G09G 2330/12* (2013.01)

(58) Field of Classification Search
CPC .... G09G 3/006; G09G 3/3233; H10K 71/861; H10K 59/1201; H10K 59/131
See application file for complete search history.

(56) References Cited

U.S. PATENT DOCUMENTS

| | | | | |
|---|---|---|---|---|
| 9,754,538 B2 * | 9/2017 | Lee | ...................... | G09G 3/3208 |
| 9,972,549 B2 * | 5/2018 | Wu | ...................... | H10K 59/131 |
| 2016/0189593 A1 * | 6/2016 | Lee | ...................... | H10K 59/123 |
| | | | | 438/4 |
| 2022/0198999 A1 * | 6/2022 | Tseng | ................... | G09G 3/3233 |

FOREIGN PATENT DOCUMENTS

| | | |
|---|---|---|
| KR | 20220067487 A | 5/2022 |
| KR | 20220086963 A | 6/2022 |
| KR | 20230051388 A | 4/2023 |
| KR | 20230071401 A | 5/2023 |

* cited by examiner

*Primary Examiner* — Sardis F Azongha
(74) *Attorney, Agent, or Firm* — Seed Intellectual Property Law Group LLP

(57) ABSTRACT

The present disclosure relates to a display panel and its repair method. The display panel may include: a first sub-pixel including a first-first light-emitting element and a first-second light-emitting element; a second sub-pixel including a second-first light-emitting element and a second-second light-emitting element; a first cathode line connected to at least one cathode electrode among a cathode electrode of the first-first light-emitting element and a cathode electrode of the first-second light emitting element, and extended toward the second sub-pixel; and a second cathode line connected to at least one cathode electrode among a cathode electrode of the second-first light-emitting element and a cathode electrode of the second-second light emitting element, and extended toward the first sub-pixel.

23 Claims, 24 Drawing Sheets

DISPLAY PANEL AND REPAIR METHOD THEREOF

CROSS-REFERENCE TO RELATED APPLICATION

This application claims the benefit and priority to Korean Patent Application No. 10-2023-0120515, filed on Sep. 11, 2023, the entirety disclosure of which is incorporated herein by reference for all purposes.

BACKGROUND

Technical Field

The present disclosure relates to a display panel and a repair method thereof.

Description of Related Art

Organic light emitting display devices reproduce images by emitting light using an organic light emitting diode (OLED) placed in each pixel according to an input image signal. The organic light emitting display devices have a fast response speed and high luminous efficiency, luminance, and viewing angle, and have an excellent contrast ratio and color reproducibility as it can express black grayscales in full black. No backlight unit is required for these organic light emitting display devices.

In recent years, the display devices that use a light emitting diode (LED), which is an inorganic light-emitting device, as the light-emitting element of pixels have attracted attention as the next generation of the display devices. Because the LEDs are made of inorganic materials, they don't require a separate encapsulation layer to protect the organic material from moisture, and they have an excellent reliability and a longer life than the OLEDs. The LEDs also have a fast light-up speed, excellent luminous efficiency, and are resistant to impact.

The description provided in the background section should not be assumed to be prior art merely because it is mentioned in or associated with the background section. The background section may include information that describes one or more aspects of the subject technology.

BRIEF SUMMARY

An aspect of the present disclosure is to provide a display panel including light-emitting elements and a repair method thereof that substantially obviate one or more of the issues due to limitations and disadvantages of the related art.

The features and aspects of the present disclosure are not limited to those mentioned above, and other features and aspects not mentioned will be clearly understood by those skilled in the art from the following description, or may be realized and attained by the structures pointed out in the present disclosure, or derivable therefrom, and the claims hereof as well as the appended drawings.

To achieve these and other aspects of the inventive concepts, as embodied and broadly described herein, a display panel according to an embodiment of the present disclosure may include: a first sub-pixel including a first-first light-emitting element and a first-second light-emitting element; a second sub-pixel including a second-first light-emitting element and a second-second light-emitting element; a first cathode line connected to at least one cathode electrode among a cathode electrode of the first-first light-emitting element and a cathode electrode of the first-second light emitting element, and extended toward the second sub-pixel; and a second cathode line connected to at least one cathode electrode among a cathode electrode of the second-first light-emitting element and a cathode electrode of the second-second light emitting element, and extended toward the first sub-pixel, wherein the first cathode line and the second cathode line partially overlap with each other.

The first cathode line and the second cathode line may be connected to or separated from each other at a portion where the first cathode line and the second cathode line overlap.

The first cathode line or the second cathode line may be separated to be insulated from each other at a portion where the first cathode line and the second cathode line do not overlap.

An anode electrode of the first-first light-emitting element may be connected to an anode electrode of the first-second light-emitting element. An anode electrode of the second-first light-emitting element may be connected to an anode electrode of the second-second light-emitting element.

The first sub-pixel may include a first driving transistor that supplies a current to the first-first light-emitting element and the first-second light-emitting element; a first-first switch transistor that switches a current path between a pixel driving voltage and a cathode voltage; and a first-second switch transistor that is connected to the anode electrode of the first-first light-emitting element and the anode electrode of the first-second light-emitting element, and is connected to at least one of the cathode electrode of the first-first light-emitting element and the cathode electrode of the first-second light-emitting element.

The second sub-pixel may include a second driving transistor that supplies a current to the second-first light-emitting element and the second-second light-emitting element; a second-first switch transistor that switches a current path between the pixel driving voltage and the cathode voltage; and a second-second switch transistor that is connected to the anode electrode of the second-first light-emitting element and the anode electrode of the second-second light-emitting element, and is connected to at least one of the cathode electrode of the second-first light-emitting element and the cathode electrode of the second-second light-emitting element.

The first-second switch transistor may be connected between a pixel driving voltage line and the first driving transistor, and the second-second switch transistor may be connected between the pixel driving voltage line and the second driving transistor The cathode electrode of the first-first light-emitting element and the cathode electrode of the first-second light-emitting element may be electrically separated. The first cathode line and the second cathode line may be electrically separated.

The cathode electrode of the first-first light-emitting element and the cathode electrode of the first-second light-emitting element may be electrically separated. The first cathode line and the second cathode line may be electrically connected. The cathode electrode of the first-second light-emitting element and the cathode electrode of the second-first light-emitting element may be electrically connected to each other. The cathode electrode of the first-second light emitting element and the cathode electrode of the second-first light-emitting element may be electrically separated from the cathode electrode of the first-first light-emitting element and the cathode electrode of the second-second light-emitting element.

The cathode electrode of the first-first light-emitting element and the cathode electrode of the first-second light-emitting element are electrically separated. The first cathode line and the second cathode line may be electrically separated. The cathode electrode of the second-first light-emitting element and the cathode electrode of the second-second light-emitting element may be electrically connected to each other.

The first cathode line and the second cathode line may be disposed with an insulating layer interposed therebetween.

There may be a hole penetrating the insulating layer, and the first cathode line and the second cathode line are connected to each other through the hole.

The first sub-pixel and the second sub-pixel may emit light of a same color and may be adjacent to each other.

To achieve these and other aspects of the inventive concepts, as embodied and broadly described herein, a repair method for the display panel according to an embodiment of the present disclosure may include electrically separating a cathode electrode of a first-first light-emitting element of a first sub-pixel from a cathode electrode of a first-second light emitting element of the first sub-pixel; and electrically connecting a first cathode line extended from the first sub-pixel to a second cathode line extended from a second sub-pixel. The first cathode line is connected to at least one cathode electrode among cathode electrodes of the first-first and first-second light-emitting elements and is extended toward the second sub-pixel. The second cathode line is connected to at least one cathode electrode among cathode electrodes of a second-first and second-second light-emitting elements of the second sub-pixel and is extended toward the first sub-pixel.

The first cathode line may be electrically separated from the first-first light-emitting element, and the repair method may further include electrically separating the cathode electrode of the first-second light-emitting element from the first cathode line.

The cathode electrode of the second-first light-emitting element may be connected to the cathode electrode of the second-second light-emitting element. The cathode electrode of the second-first light-emitting element and the cathode electrode of the second-second light-emitting element may be electrically separated from the cathode electrode of the first-first light-emitting element and the cathode electrode of the first-second light-emitting element.

The second-first light-emitting element and the second-second light emitting element may be capable of emitting light. The first-first light-emitting element and the second-second light emitting element may be a dark point that does not emit light.

The first-first light-emitting element, the second-first light-emitting element, and the second-second light-emitting element may be capable of emitting light. The first-second light-emitting element may be a dark point that does not emit light.

The repair method may further include electrically separating the cathode electrode of the second-first light-emitting element from the cathode electrode of the second-second light-emitting element.

The cathode electrode of the first-second light-emitting element and the cathode electrode of the second-first light-emitting element may be electrically connected. The cathode electrode of the first-second light-emitting element and the cathode electrode of the second-first light-emitting element may be electrically separated from the cathode electrode of the first-first light-emitting element and the cathode electrode of the second-second light-emitting element.

The first-second light-emitting element and the second-first light-emitting element may be capable of emitting light. The first-first light-emitting element and the second-second light-emitting element may be a dark point that does not emit light.

According to embodiments of the present disclosure, a display panel advantageous for process optimization, high efficiency, high luminance, and long lifespan may be implemented by using a pixel structure that facilitates dark point improvement.

According to embodiments of the present disclosure, various defect states of the compensation circuit and the light-emitting element chip may be identified and repair processing optimized for each defect state can be performed. Based on the results of camera photography of the repaired sub-pixels of the display panel, the luminance of each sub-pixel may be compensated.

In embodiments of the present disclosure, a plurality of light-emitting elements may be connected to one compensation circuit disposed in a sub-pixel. Repair processing may be performed to prevent or reduce dark points from occurring between these sub-pixels.

The effects according to the present disclosure are not limited to those effects mentioned above, and other effects not mentioned may be clearly understood by those skilled in the art from the description of the claims.

It is to be understood that both the foregoing general description and the following detailed description are examples and explanatory and are intended to provide further explanation of the inventive concepts as claimed.

BRIEF DESCRIPTION OF THE SEVERAL VIEWS OF THE DRAWINGS

The accompanying drawings, that may be included to provide a further understanding of the disclosure and may be incorporated in and constitute a part of the disclosure, illustrate embodiments of the disclosure and together with the description serve to explain various principles of the disclosure.

The above and other aspects, features, and effects of the present disclosure will become more apparent to those of ordinary skill in the art by describing example embodiments thereof in detail with reference to the attached drawings, in which.

Figure 1:
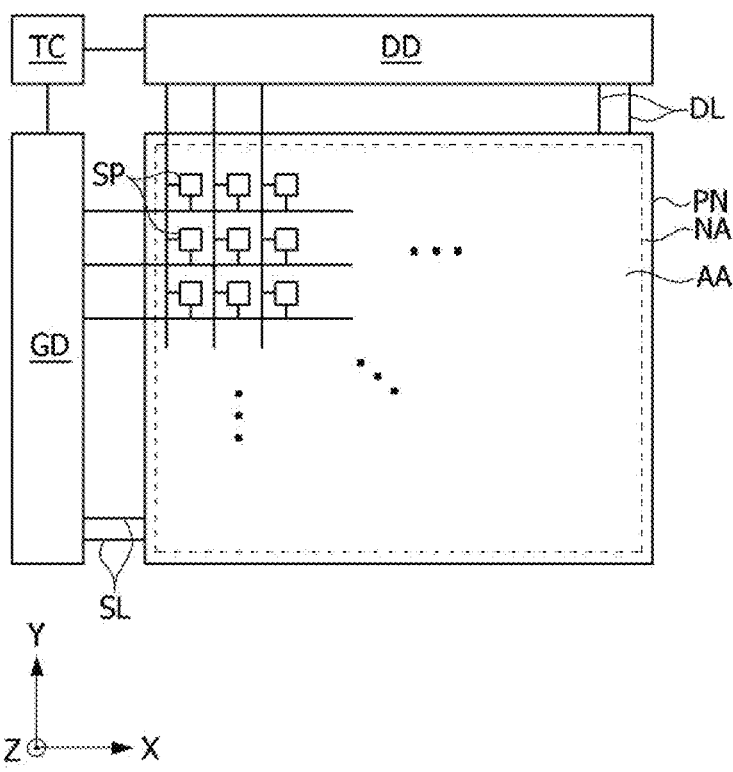
FIG. 1 is a block diagram schematically showing the configuration of a display device according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted or briefly provided. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations may be selected only for convenience of writing the specification and may be thus different from those used in actual products.

The advantages and features of the present disclosure and methods for accomplishing the same will be more clearly understood from example embodiments described below with reference to the accompanying drawings. However, the present disclosure is not limited to the following embodiments, but may be implemented in various different forms; rather, the present embodiments will make the disclosure of the present disclosure complete and allow those skilled in the art to fully comprehend the scope of the present disclosure.

The shapes, sizes, ratios, angles, numbers, and the like, which are illustrated in the drawings to describe various example embodiments of the present disclosure are merely given by way of example. Therefore, the present disclosure is not limited to the illustrations in the drawings. The same or similar elements are designated by the same reference numerals throughout the specification unless otherwise specified. In the following description where the detailed description of the relevant known function or configuration may unnecessarily obscure an important point of the present disclosure, a detailed description of such known function of configuration may be omitted or briefly provided. Any implementation described herein as an "example" is not necessarily to be construed as preferred or advantageous over other implementations.

In construing an element, the element is construed as including an error range or tolerance range although there is no explicit description of such an error or tolerance range.

The terms such as "comprising", "including", and "having" used herein are generally intended to allow other components to be added unless the terms are used with the term such as "only". References to the singular shall be construed to include the plural unless expressly stated otherwise.

When describing a positional or interconnected relationship between two components, such as "on," "over," "under," "above," "below," "beneath," "near," "close to," or "adjacent to," "beside," "next to," "connect or couple with", "crossing", "intersecting", etc., one or more other components may be interposed between them unless a more limiting term, such as "immediately", "closely" or "directly" is used. Furthermore, the terms "left," "right," "top," "bottom, "downward," "upward," "upper," "lower," and the like refer to an arbitrary frame of reference.

When describing a temporal contextual relationship is described, such as "after", "following", "next to" or "before", it may not be continuous on a time scale unless a more limiting term, such as "just", "immediately" or "directly" is used.

The terms "first", "second," "A," "B," "(a)," and "(b)," and the like may be used to distinguish components from each other, but the functions or structures of the components are not limited by ordinal numbers or component names in front of the components. Also, when an element or layer is described as being "connected," "coupled," or "adhered" to another element or layer, the element or layer can not only be directly connected, or adhered that other element or layer, but also be indirectly connected, or adhered that other another element or layer with one or more intervening elements or layers disposed between the elements or layers, unless otherwise specified.

The term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, or the third element.

Features of the following embodiments may be combined or associated with each other in whole or in part, and various types of interlocking and driving are technically possible. The embodiments may be implemented independently of each other or together in an interrelated relationship.

A transistor is a three-electrode element including a gate, a source, and a drain. The source is an electrode that supplies carriers to the transistor. In the transistor, carriers start to flow from the source. The drain is an electrode through which carriers exit from the transistor. In a transistor, carriers flow from a source to a drain. In the case of an n-channel transistor, since carriers are electrons, a source voltage is a voltage lower than a drain voltage such that electrons may flow from a source to a drain. The n-channel transistor has a direction of a current flowing from the drain to the source. In the case of a p-channel transistor (for example, p-channel metal-oxide semiconductor (PMOS)), since carriers are holes, a source voltage is higher than a drain voltage such that holes may flow from a source to a drain. In the p-channel transistor, since holes flow from the source to the drain, current flows from the source to the drain. It should be noted that a source and a drain of a transistor are not fixed. For example, a source and a drain may be changed according to an applied voltage. Therefore, the disclosure is not limited to a source and a drain of a transistor. In the following description, a source and a drain of a transistor will be referred to as a first electrode and a second electrode respectively, and vice versa.

A gate signal may swing between a gate-on voltage and a gate-off voltage. A transistor is turned on in response to a gate-on voltage and is turned off in response to a gate-off voltage. In the case of an n-channel transistor, the gate-on voltage may be a gate high voltage VGH, and the gate-off voltage may be a gate low voltage VGL. In the case of a p-channel transistor, the gate-on voltage may be the gate low voltage VGL, and the gate-off voltage may be the gate high voltage VGH.

A 'line' mentioned in embodiments of the present disclosure may be interpreted as a wire to which a signal or a voltage is applied.

Unless otherwise defined, all terms used in the embodiments of the disclosure (including technical and scientific terms) are to be construed as they would be commonly understood by one of ordinary skill in the art to which the disclosure belongs, unless otherwise specifically defined and described, and commonly used terms, such as dictionary defined terms, are to be construed in light of their contextual meaning in the relevant art and should not be interpreted in an idealized or overly formal sense unless expressly so defined herein. For example, the term "part" or "unit" may apply, for example, to a separate circuit or structure, an integrated circuit, a computational block of a circuit device, or any structure configured to perform a described function as should be understood to one of ordinary skill in the art.

Hereinafter, example embodiments of the present disclosure will be described in detail with reference to the accompanying drawings.

Referring to FIG. 1, a display device includes a display panel PN having a plurality of pixels disposed in a display area AA, and a display panel driving circuit for driving the display panel PN.

The display panel PN may be, but is not limited to, a panel having a rectangular structure with a length in the X-axis direction, a width in the Y-axis direction, and a thickness in the Z-axis direction. The pixels include a plurality of sub-pixels SP with different colors. The display area AA on which an input image is displayed on the display panel PN may be a screen visible from the front surface of the display panel PN.

The display panel driving circuit includes a data driver DD, a gate driver GD, and a timing controller TC that controls the gate driver GD and the data driver DD.

The input image is displayed by the sub-pixels SP disposed in the display area AA of the display panel PN. Each of the sub-pixels SP includes a light-emitting element and the pixel circuit that drives the light-emitting element. The light-emitting element may be a light-emitting diode (LED) or a micro light-emitting diode (micro LED), but the present disclosure is not limited thereto.

On the display panel PN, a plurality of scan lines SL and a plurality of data lines DL are arranged to cross each other. Each of the sub-pixels SP is connected to a scan line SL and a data line DL. Power wires omitted in FIG. 1 may be connected to the sub-pixels SP, respectively. In the display panel PN, a non-display area NA may be disposed outside the display area AA. It is to be noted that the size of the non-display area NA may be small enough such that the non-display area NA may not be recognized. In this case, the display panel PN may be referred to as zero-bezel display panel.

The gate driver GD supplies a gate signal to the gate lines SL in response to a gate control signal provided by the timing controller TC. The gate driver GD may be disposed at least in the non-display area NA of the display panel PN, as shown in FIG. 1, or in the display area AA, and the present disclosure is not limited thereto.

The data driver DD converts the image data received from the timing controller TC into a gamma compensation voltage in response to a data control signal provided by the timing controller TC and outputs a data voltage. The data voltage output from the data drive DD is fed to the data lines DL.

The timing controller TC aligns image data input from the outside and supplies the aligned image data to the data driver DD. The timing controller TC may generate gate control signals and data control signals based on timing signals synchronized with input image signals, for example, dot clock signals, data enable signals, and horizontal/vertical synchronization signals. The timing controller TC supplies the gate control signals to the gate driver GD and the data control signals to the data driver DD to control the timing of the operation of the gate driver GD and data driver DD.

The non-display area NA may have a link wire and a pad electrode disposed therein to transmit signals to the sub-pixels SP in the display area AA. One or more of a gate driver IC in which a circuit of the gate driver GD is integrated and a data driver IC in which a circuit of the data driver DD is integrated may be disposed in the non-display area NA. One or more of the gate driver IC and the data driver IC may be disposed on the rear surface of the display panel PN, for example, the rear surface without sub-pixels SP. The non-display area NA may be minimized or reduced so that it is not visible when the image is displayed on the display panel PN.

The display panel driving circuit may be connected to the display panel PN in a variety of ways. For example, the gate driver GD may be disposed by a gate in panel (GIP) method in the non-display area NA, or by a gate in active area (GIA) method between the sub-pixels SP in the display area AA. The data driver DD and the timing controller TC may be formed on a separate flexible film and PCB, and the data driver DD and the timing controller TC may be electrically connected to the display panel PN by bonding the terminals of the flexible film to the pad electrode formed on the non-display area NA of the display panel PN. The flexible film bonded to the display panel PN may be connected to a PCB on which the circuit elements are mounted and the wires are formed.

Figure 2:
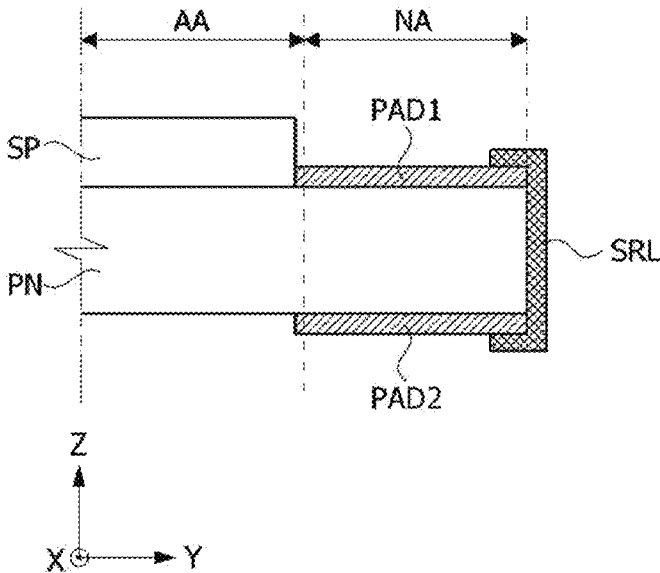
FIG. 2 is a partial cross-sectional view showing a pad portion and side wiring disposed on the periphery of the display panel according to an embodiment of the present disclosure.

A side wiring for connecting a signal wire on the front surface of the display panel PN to the pad electrode on the rear surface of the display panel PN may be formed on the side surface of the outer periphery of the display panel PN. Such a method of electrical connection between the front surface and the rear surface of the display panel PN via the side wiring may be used to maximally minimize or largely reduce the non-display area NA visible on the front surface of the display panel PN. In FIG. 2, "SRL" denotes this side wiring. When the gate driver GD, the data driver DD, and the timing controller TC are electrically connected to the display panel PN as described above, it is possible to substantially realize a screen without a bezel on the display panel PN Referring to FIG. 2, a plurality of pad electrodes are disposed in the non-display area NA of the display panel PN to transmit various signals to the sub-pixels SP. For example, a first pad electrode PAD1, which transmits signals to the sub-pixels SP, may be disposed in the non-display area NA located at the front surface of the display panel PN. A second pad electrode PAD2, which is electrically connected to circuit components such as the flexible film and the PCB, is disposed in the non-display area NA at the rear surface of the display panel PN. Only the pad area in which the first pad electrode PAD1 is located is arranged in the non-display area NA located at the front outer periphery of the display panel PN in which an image is displayed, thereby minimizing or reducing the size of the non-display area.

Various signal wires connected to the sub-pixels SP, such as gate line SL or the data line DL, may extend into the non-display area NA and be electrically connected to the first pad electrode PAD1.

The display panel PN may include the side wiring SRL which is disposed on the side surface of the outer periphery of the display panel PN. The side wiring SRL may electrically connect the first pad electrode PAD1 disposed on the front outer periphery of the display panel PN and the second pad electrode PAD2 disposed on the rear outer periphery of the display panel PN while traversing the side surface of the display panel PN. The signals output from the circuit components disposed on the rear surface of the display panel PN may be transmitted to the sub-pixels SP and the gate driver GD within the display area AA through the second pad electrode PAD2, the side wiring SRL, and the first pad electrode PAD1. Accordingly, a signal transmission path traversing the front, side, and rear surfaces may be formed at the outer periphery of the display panel PN, thereby minimizing or reducing the area of the non-display area NA on the front surface of the display panel PN.

Multiple display modules may be combined on one plane to implement a wide-screen tiled display device. Each of the display modules may be implemented as a single display device, and a combination of multiple display modules may be implemented as a wide-screen tiled display device. Each of the display modules may include a single sheet of a display panel PN, a driving circuit of the display panel PN, and cover members of the circuit components and modules coupled to the rear surface of the display panel PN.

Figure 3:
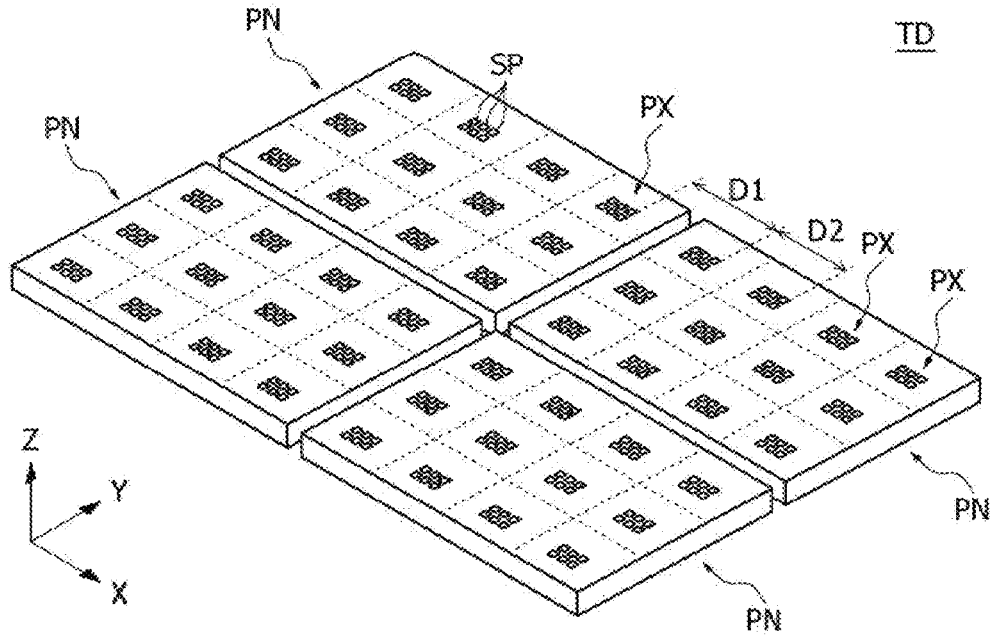
FIG. 3 is a perspective view illustrating a tiling display device according to an embodiment of the present disclosure.

Referring to FIG. 3, a wide-screen tiled display TD includes a plurality of display modules disposed on an X-Y plane. Each of the display modules includes a display panel PN on which an input image is reproduced. When the non-display area NA is minimized or reduced at the front outer periphery of each display panel PN, a wide-screen image may be reproduced with no visible seams between adjacent display panels PN.

The display panels PN may be assembled on a plane such that the space D1 between the outermost pixel PX of one display panel PN and the outermost pixel PX of another display panel PN adjacent to that display panel PN is substantially the same as the space D2 between adjacent pixels PX within the display area AA of the display panel PN. As a result, the spaces D1 and D2 between the adjacent pixels PX is the same throughout the wide-screen display area of the tiled display TD, and thus the seam area is not visible.

In the tiled display TD, multiple display modules may share one timing controller TC. A host system may be connected to a plurality of timing controllers TC, may transmit to the timing controllers TC image signals to be reproduced on all of the display panels PN implementing the large-screen of the tiled display TD, and may synchronize the timing controllers TC.

Figure 4:
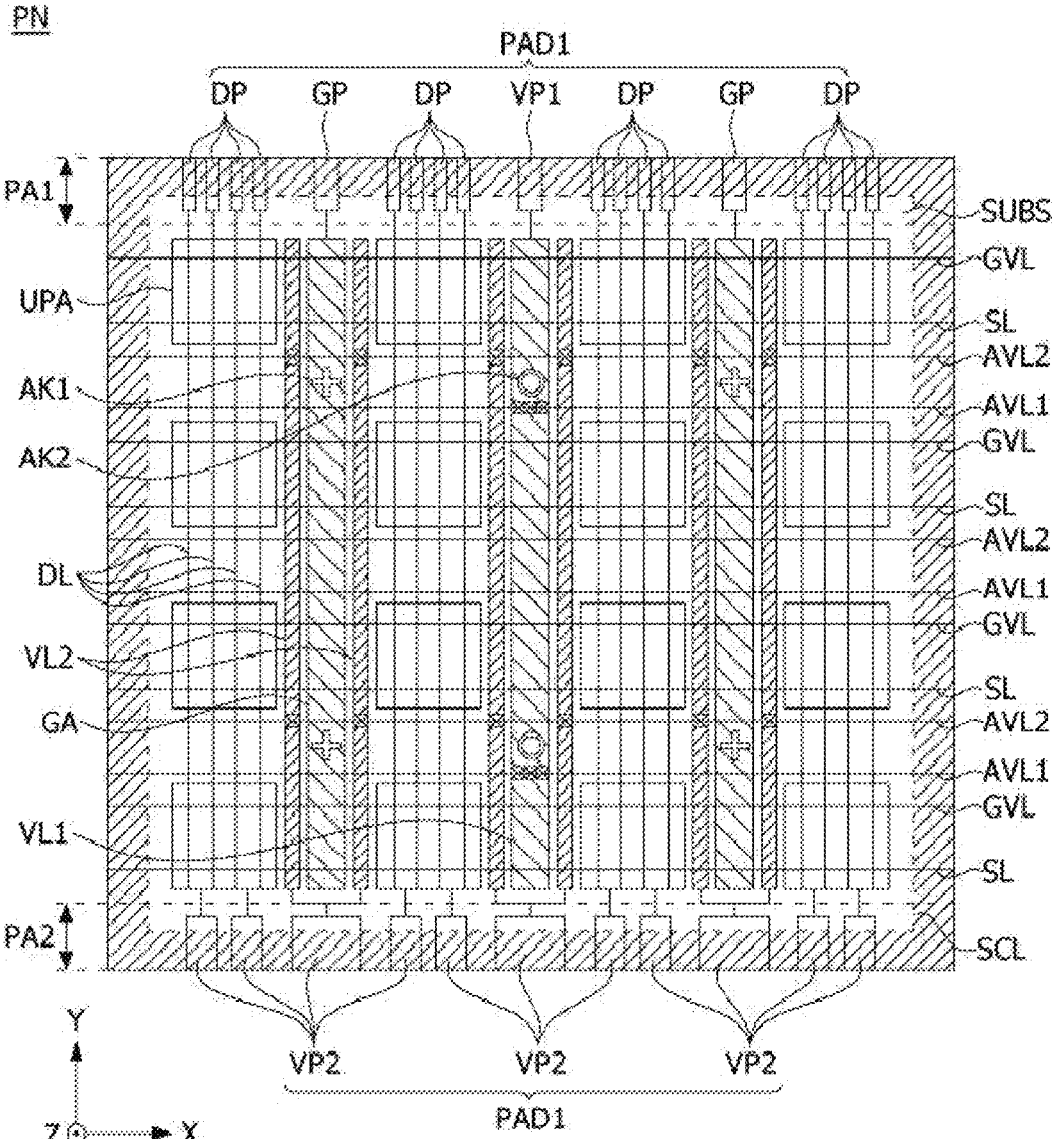
FIG. 4 is a plan view schematically illustrating the planar structure of a display panel according to an embodiment of the present disclosure.

FIG. 4 is a plan view schematically illustrating a planar structure of a display panel according to one embodiment of the present disclosure.

Referring to FIG. 4, a display panel PN includes a substrate SUBS on which a pixel array and a circuit of a gate driver GD are disposed. The display panel 100 may be, but is not limited to, a panel having a rectangular structure with a length in the row direction (X-axis direction), a width in the column direction (Y-axis direction), and a thickness in the thickness direction (Z-axis direction).

The substrate SUBS may be an insulating substrate that supports components disposed on the upper portion of a display device. The substrate SUBS may be a stacked structure of multiple substrates. The substrate SUBS may may include glass, plastic, or a flexible polymer film. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS), which is only an example and is not necessarily limited thereto.

On one surface (or front surface) of the substrate SUBS, the display area AA may include a plurality of pixel areas UPA, a plurality of gate driving areas GA, and a plurality of pad areas PA1, PA2. One or more pixels PX may be disposed in each of the pixel areas UPA. The pixel areas UPA may be arranged along a plurality of row lines and a plurality of column lines. Each of the pixels PX include a plurality of sub-pixels SP with different colors. Each of the sub-pixels SP may include a light-emitting element and a pixel circuit, and emit light independently. The sub-pixels SP may include, but are not limited to, red sub-pixels, blue sub-pixels, and green sub-pixels. For example, the sub-pixels SP may also include white sub-pixels, or cyan sub-pixels, magenta sub-pixels, and yellow sub-pixels.

The plurality of gate driving areas GA includes circuits of gate drivers GD. The gate driving areas GA may be formed along a row direction and/or a column direction between the plurality of pixel areas UPA. A gate driver GD formed in a gate driving area GA may provide a gate signal to a plurality of gate lines SL. The gate driving area GA may be disposed between adjacent pixel areas UPA in the row direction (X-axis direction).

A first pad area PA1 includes a plurality of first pad electrodes PAD1 disposed on the front outer periphery of one side (or upper side) of the display panel PN. The first pad electrodes PAD1 may transmit various signals to various wires extending in the column direction from the display area AA. The first pad electrodes PAD1 include data pads DP connected to data lines DL for transmitting a data voltage from the data driver DD to the data lines DL, and gate pads GP connected to the gate driver GD for transmitting gate control signals such as a clock signal, start signal, gate-low voltage, gate-high voltage, etc., to the gate driver GD. The clock signal, start signal, gate-low voltage, gate-high voltage, etc., for driving the gate driver GD may be generated from the timing controller TC and applied to the gate pads GP via a level shifter and a PCB. The first pad electrodes PAD1 may include a plurality of power wires to which a direct current voltage (or a constant voltage) is applied.

The substrate SUBS of the display panel PN includes gate driving wires connected to the gate pads GP and extending in the column direction and a plurality of gate driving wires GVL extending in the row direction. The gate driving wires in the column direction and the gate driving wires GVL in the row direction may be connected through contact holes penetrating an insulating film. The gate driving wires GVL delivery signals to drive the gate drivers GD distributed and disposed in the gate driving area GA, such as the clock signal, start signals, gate-high voltages, gate-low voltages, etc., to the circuits of the gate drives GD.

A second pad area PA2 includes a plurality of first pad electrodes PAD1 disposed on the front outer periphery of the other side (or lower side) of the display panel PN. The second pad area PA2 may include a plurality of low-potential power pads VP2.

A DC voltage to be applied to the power wires may be output from a power supply circuit omitted in the drawings, and may be applied to the power pads VP1 and VP2 connected to the power wires through the PCB. The power supply circuit may be a DC-DC converter disposed on the PCB or control boards CTB1 and CTB2 arranged on the rear surface of the display panel PN to convert a DC input voltage from a main power source to a DC voltage suitable for driving the display panel PN.

The power pads VP1 and VP2 connected to the power wires may include a plurality of high-potential power supply pads VP1 disposed on the first pad area PA1 for supplying a high-potential power voltage to high-potential power supply wires VL1, and a plurality of low-potential power supply pads VP2 disposed on the second pad area PA2 for supplying a low-potential power voltage to low-potential power supply wires VL2.

The data pads DP, which are connected one-to-one to the data lines DL, may have a relatively narrow width, while the power pads VP1 and VP2 and the gate pads GP may have a relatively wide width. The low-potential power pads VP2 may have a wider width compared to the high-potential power pads VP2.

In order to minimize or reduce the outermost non-display area NA of the display panel PN, the pixel array, the wires, and the pads are formed on the front surface of the substrate of the display panel PN, and then the outermost periphery at the outside of a scribing line SCL indicated by a dotted line may be removed to provide the substrate SUBS with a minimized or reduced non-display area NA. After the scribing process, the rough edges of the outer periphery of the substrate SUBS may be ground or laser trimmed. This will leave the short pad electrodes PAD1 and PAD2 with a reduced size on the front outer periphery of the substrate SUBS.

The data lines DL may extend in the column direction (Y-direction) on the substrate SUBS and overlap the pixel areas UPA. The data lines DL supply the data voltages to the respective pixel circuits of the sub-pixels SP. The gate lines SL may extend in the row direction (X-direction) on the substrate SUBS of the display panel PN and overlap the pixel areas UPA and the gate driving areas GA. The gate lines SL may supply the gate signals from the gate driver GD to the respective pixel circuits of the sub-pixels SP across the pixel areas UPA and the gate driving areas GA.

The high-potential power wires VL1 extend in the column direction (Y-direction), and at least one of them is connected in a mesh structure to auxiliary high-potential power wires AVL1 extending in the row direction (X-direction). The auxiliary high-potential power wires AVL1 are connected to the sub-pixels SP arranged in the row direction (X-direction). Therefore, the high-potential power voltage applied to the high-potential power wires VL1 may be supplied to the sub-pixels SP through the auxiliary high-potential power wires AVL1.

The low-potential power wires VL2 may extend in the column direction (Y-direction), and at least one of them may be connected in a mesh structure to auxiliary low-potential power wires AVL2 extending in the row direction (X-direction). The auxiliary low-potential power wires AVL2 are connected to the sub-pixels SP arranged in the row direction (X-direction). Therefore, the sub-pixels SP are connected to the auxiliary low-potential power wires AVL2 to which the low-potential power voltage is applied.

The mesh structure of the power wires may allow the resistance of the power wires to be reduced, which may improve the voltage drop of the high-potential power voltage and the deviation of the power voltage within the display area AA.

The substrate SUBS of the display panel PN may have one or more alignment keys AK1 and AK2 arranged between the pixel areas UPA. The alignment keys AK1 and AK2 may be used for alignment in the manufacturing process of the display panel PN. A first alignment key AK1 may be disposed in the gate driving area GA. The first alignment key AK1 may be used to check the aligned position of each of the light-emitting elements. The first alignment key AK1 may be formed in a cross pattern, but is not limited thereto. A second alignment key AK2 may overlap the high-potential power wires VL1. The high-potential power wires VL1 may include a hole formed in a position overlapping the second alignment key AK2, so that the second alignment key AK2 and the high-potential power wires VL1 may be distinguished and spaced apart from each other. The second alignment key AK2 may be used to align the display panel PN with a donor substrate. The donor substrate is an intermediate medium for mounting the light-emitting elements on the substrate SUBS of the display panel PN. A plurality of light-emitting elements fabricated on a semiconductor wafer may be attached to and transferred to the donor substrate, and the light-emitting elements attached to the donor substrate may be transferred onto the substrate SUBS. The second alignment key AK2 may be formed in a circular or ring pattern, but is not limited to that. It is to be noted that although FIG. 4 of the present disclosure shows a detailed planar structure of the display panel, but it is only provided by way of example, and the present disclosure is not limited thereto. For example, the arrangement and numbers of the pad areas PA1 and PA2 may be variously changed, the one or more alignment keys AK1 and AK2 may be omitted, and/or the arrangement and shapes of the gate driving area GA may be variously changed.

Each of the sub-pixels SP includes a pixel circuit that drives the light-emitting element.

FIGS. 5A to 6B are circuit diagrams showing a pixel circuit according to an embodiment of the present disclosure. FIGS. 5A to 6B show an example in which the driving element DT and the switch elements M1 and M2 are implemented with, but not limited to, p-channel transistors.

Figure 5A:
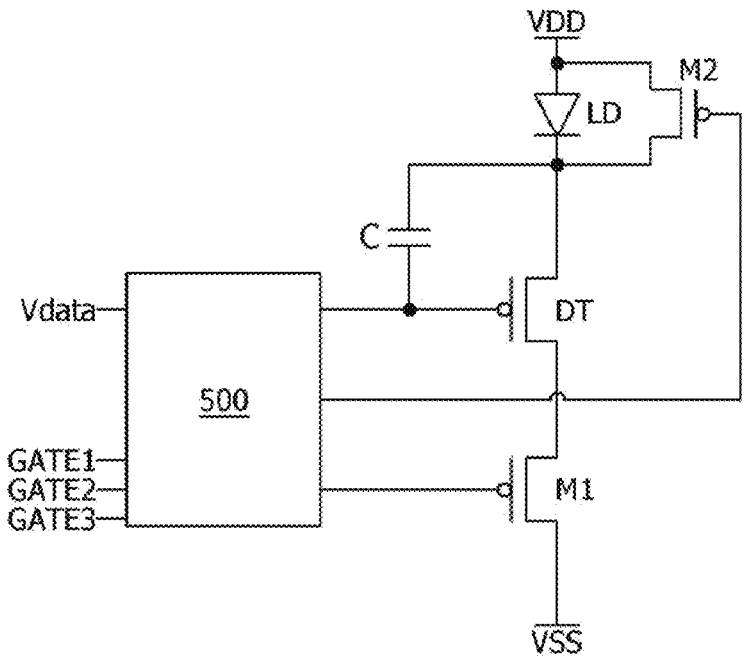
FIGS. 5A to 6B are circuit diagrams showing examples of a pixel circuit according to an embodiment of the present disclosure.
Figure 5B:
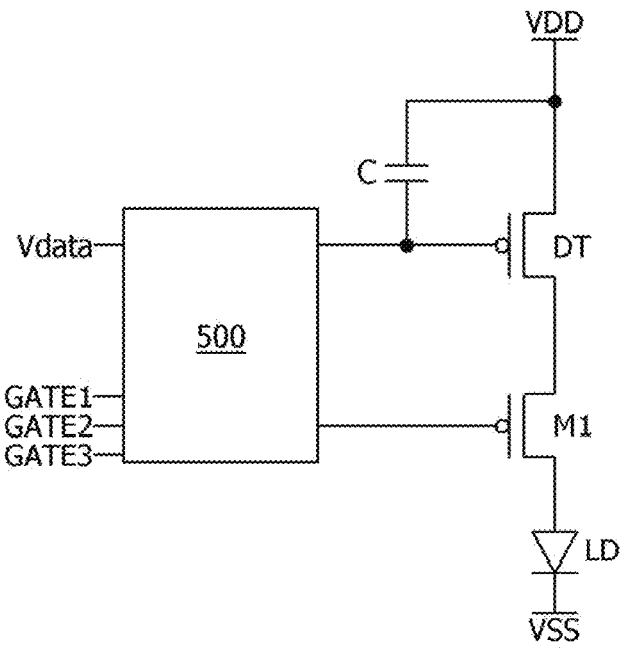

With reference to FIGS. 5A and 5B, the pixel circuit includes a light-emitting element LD, a driving element DT, a first switch element M1, and a compensation circuit 500. In this embodiment, one driving element DT may be electrically connected to one compensation circuit 500 and one light-emitting element LD.

The light-emitting element LD may be a micro LED. The light-emitting element LD may include an anode electrode and a cathode electrode. The light-emitting element LD may have, but not limited to, a vertical structure in which electrodes are disposed on the upper part and lower part of a chip in which light-emitting elements are integrated. The light-emitting element LD may be implemented in a lateral structure or a flip chip structure.

The light-emitting element LD, the driving element DT, and the switch element M1 may be connected in series between the pixel driving voltage VDD and the cathode voltage VSS.

The driving element DT adjusts a current flowing through the drain-source channel according to the gate-source voltage. The gate-source voltage of the driving element DT is varied depending on the data voltage Vdata of pixel data applied to the gate electrode of the driving element DT. Hence, the current flowing through the driving element DT changes depending on the data voltage Vdata. The light-emitting element LD may be driven by a current from the driving element DT to emit light. A capacitor C may be connected between the gate electrode and the first electrode of the driving element DT. The capacitor C is charged with the gate-source voltage of the driving element DT.

The driving element DT may be connected between the light-emitting element LD and the first switch element M1 as shown in FIG. 5A. In this case, the driving element DT includes a gate electrode to which the data voltage Vdata is applied, a first electrode connected to the cathode electrode of the light-emitting element LD, and a second electrode connected to the first electrode of the first switch element M1.

The driving element DT may be connected between a node to which the pixel driving voltage VDD is applied and the first switch element M1 as shown in FIG. 5B. In this case, the driving element DT includes a gate electrode to which the data voltage Vdata is applied, a first electrode to which the pixel driving voltage VDD is applied, and a second electrode connected to the first electrode of the switch element M1.

The first switch element M1 switches the current path between the pixel driving voltage VDD and the cathode voltage VSS. The first switch element M1 may be turned on in response to the gate-on voltage of one of the gate signals GATE1, GATE2, and GATE3, and may be turned off in response to the gate-off voltage. When the switch element M1 is turned on, the driving element DT and the light-emitting element LD may be electrically connected, so that a current may be supplied to the light-emitting element LD. When the first switch element M1 is turned off, the current path between the pixel driving voltage VDD and the cathode voltage VSS is cut off, so that no current is supplied to the light-emitting element LD.

The first switch element M1 may be connected between the driving element DT and the cathode voltage VSS as shown in FIG. 5A. In this case, the first switch element M1 includes a gate electrode connected to the first gate line, a first electrode connected to the second electrode of the driving element DT, and a second electrode connected to the node to which the cathode voltage VSS is applied.

The first switch element M1 may be connected between the driving element DT and the light-emitting element LD as shown in FIG. 5B. In this case, the first switch element M1 includes a gate electrode connected to the first gate line, a first electrode connected to the second electrode of the driving element DT, and a second electrode connected to the anode electrode of the light-emitting element LD.

The pixel driving voltage VDD and the cathode voltage VSS are applied to all pixels PX in the display panel PN. For example, the pixel driving voltage VDD may be applied to the pixels PX through a first power line connected to all pixels PX, and the cathode voltage VSS may be applied to the pixels PX through a second power line connected to all pixels PX. Meanwhile, a third constant voltage, for example, a reference voltage, may be commonly applied to all pixels through a third power line.

Figure 6A:
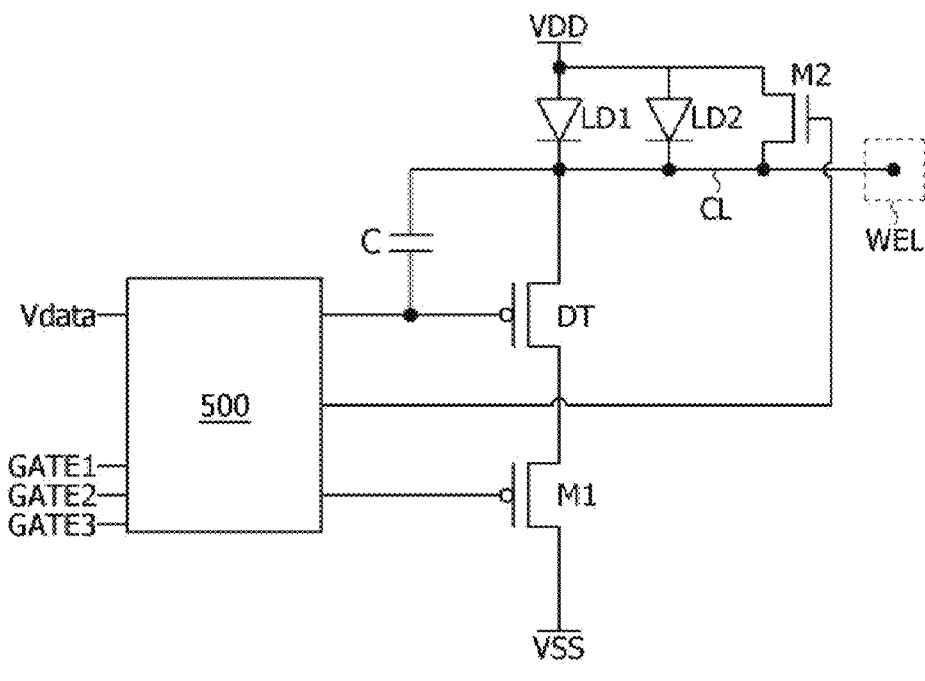
Figure 6B:
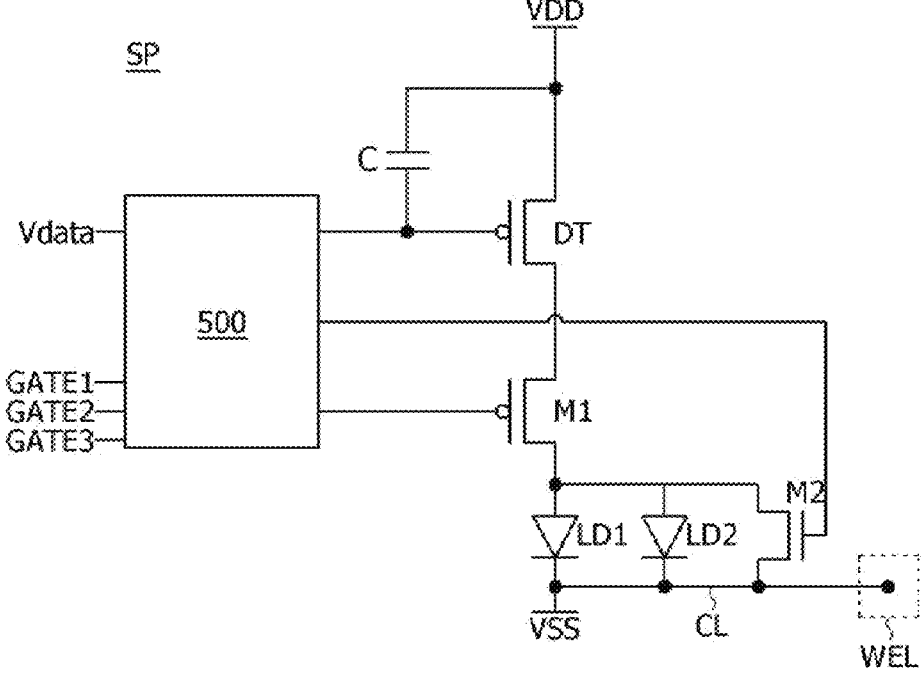

With reference to FIGS. 6A and 6B, the pixel circuit includes a first light-emitting element LD1, a second light-emitting element LD2, a driving element DT, a switch element M1, and a compensation circuit 500. In this embodiment, one driving element DT may be connected to one compensation circuit 500 and two light-emitting elements LD1 and LD2 connected in parallel.

The first and second light-emitting elements LD1 and LD2 may each be a micro LED. Each of the light-emitting elements LD1 and LD2 may include an anode electrode and a cathode electrode. The light-emitting element LD may have, but not limited to, a vertical structure in which electrodes are disposed on the upper part and lower part of a chip in which light-emitting elements are integrated. The light-emitting element LD may be implemented in a lateral structure or a flip chip structure.

The first and second light-emitting elements LD1 and LD2 may be connected in parallel. For example, the first and second light-emitting elements LD1 and LD2 may be connected in parallel between the pixel driving voltage VDD and the driving element DT as shown in FIG. 6A. In this case, the anode electrodes of the first and second light-emitting elements LD1 and LD2 may be connected to the node to which the pixel driving voltage VDD is applied, and the cathode electrodes of the first and second light-emitting elements LD1 and LD2 may be connected to the first electrode of the driving element DT.

The first and second light-emitting elements LD1 and LD2 may be connected in parallel between the switch element M1 and the cathode voltage VSS as shown in FIG. 6B. In this case, the anode electrodes of the first and second light-emitting elements LD1 and LD2 may be connected to the second electrode of the first switch element M1, and the cathode electrodes of the first and second light-emitting elements LD1 and LD2 may be connected to the node to which the cathode voltage VSS is applied.

The driving element DT adjusts the current flowing through the drain-source channel according to the gate-source voltage. The gate-source voltage of the driving element DT may vary depending on the data voltage Vdata of pixel data applied to the gate electrode of the driving element DT. Hence, the current flowing through the driving element DT changes depending on the data voltage Vdata. The first and second light-emitting elements LD1 and LD2 may be driven by the current from the driving element DT to emit light. A capacitor C may be connected between the gate electrode and the first electrode of the driving element DT. The capacitor C is charged with the gate-source voltage of the driving element DT.

The driving element DT may be connected between the first and second light-emitting elements LD1 and LD2 and the switch element M1 as shown in FIG. 6A. In this case, the driving element DT includes a gate electrode to which data voltage Vdata is applied, a first electrode connected to the cathode electrodes of the first and second light-emitting elements LD1 and LD2, and a second electrode connected to the first electrode of the switch element M1.

The driving element DT may be connected between the node to which the pixel driving voltage VDD is applied and the switch element M1 as shown in FIG. 6B. In this case, the driving element DT includes a gate electrode to which the data voltage Vdata is applied, a first electrode to which the pixel driving voltage VDD is applied, and a second electrode connected to the switch element M1.

The first switch element M1 may be connected between the driving element DT and the cathode voltage VSS as shown in FIG. 6A. The first switch element M1 may be connected between the driving element DT and the light-emitting elements LD1 and LD2 as shown in FIG. 6B.

The pixel circuit may further include a second switch element M2. The second switch element M2 may be connected between the cathode electrode and the anode electrode of the light-emitting element LD, LD1 or LD2 as shown in FIGS. 5A and 6A, and may be turned on in response to the gate signal applied through the compensation circuit 500. When the second switch element M2 is turned on, the cathode electrode and anode electrode of the light-emitting element LD, LD1 or LD2 is short circuited, so that the light-emitting element LD, LD1 or LD2 does not emit light. The second switch element M2 may prevent the light-emitting element LD, LD1 or LD2 from emitting light when the pixel circuit is initialized and when the threshold voltage of the driving element DT is sampled. The second switch element M2 includes a gate electrode connected to the second gate line, a first electrode connected to the anode electrode of the light-emitting element LD, LD1 or LD2, and a second electrode connected to the cathode electrode of the light-emitting element LD, LD1 or LD2.

The first switch element M1 may be turned on in response to the gate-on voltage of the emission signal which may be one of the one or more gate signals GATE1, GATE2 and GATE3, and may be turned off in response to the gate-off voltage of the emission signal, without being limited thereto. The second switch element M2 may be turned on in response to the gate-on voltage of the first scan signal, and may be turned off in response to the gate-off voltage of the first scan signal, without being limited thereto. It is noted that the structure of the pixel circuit shown in each of FIGS. 5A to 6B is provided by way of example only, and the present disclosure is not limited thereto. For example, more or less transistors and capacitors could be included in the pixel circuit of the present disclosure.

The compensation circuit 500 is connected to the data line to which the data voltage Vdata is applied, the gate line to which one or more gate signals GATE1, GATE2 and GATE3 are applied, the gate electrode of the driving element DT, and the gate electrode of the switch element M1. The first to third gate signals GATE1, GATE2 and GATE3 may be applied to the compensation circuit 500. The first to third gate signals GATE1, GATE2 and GATE3 may be interpreted as, but not limited to, a first scan signal, a second scan signal, and an emission signal, respectively. It is to be noted that the first to third gate signals GATE1, GATE2 and GATE3 are provided by way of example only, and the pixel circuit of the present disclosure may include more or less gate signals than that shown in FIGS. 5A to 6B.

The compensation circuit 500 transfers the data voltage Vdata to the gate electrode of the driving element DT by using one or more transistors. The compensation circuit 500 samples the threshold voltage of the driving element DT on the capacitor C to compensate the gate voltage of the driving element DT as much as the threshold voltage of the driving element DT. The compensation circuit 500 may compensate for the threshold voltage of the driving element DT by using a source follower or diode connection circuit. However, the present disclosure is not limited thereto. For example, the compensation circuit 500 may be omitted from the pixel circuit, and the threshold voltage of the driving element DT may be compensated in an external compensation method in which a driving characteristic (a threshold voltage, mobility, etc.) of each pixel and the input video/image data may be modulated by an external compensation circuit outside a display panel based on a sensing result to compensate for a driving characteristic change of each pixel.

The pixel circuit shown in FIGS. 5A to 6B may be electrically connected to the light-emitting element of another sub-pixel of the same color. For example, as shown in FIGS. 6A and 6B, the cathode line CL may be connected to the cathode electrodes of the first and second light-emitting elements LD1 and LD2 connected in parallel. The cathode line CL may be connected to the cathode electrodes of the first and second light-emitting elements LD1 and LD2 of the sub-pixel, and may be extended toward another sub-pixel of the same color. A welding portion WEL that overlaps a cathode line CL extended from another sub-pixel may be disposed at an end of the cathode line CL. In the repair process, at least one cathode among the light-emitting elements included in neighboring sub-pixels of the same color may be selectively connected to the cathode of the light-emitting element of another sub-pixel at the welding portion WEL.

Figure 7:
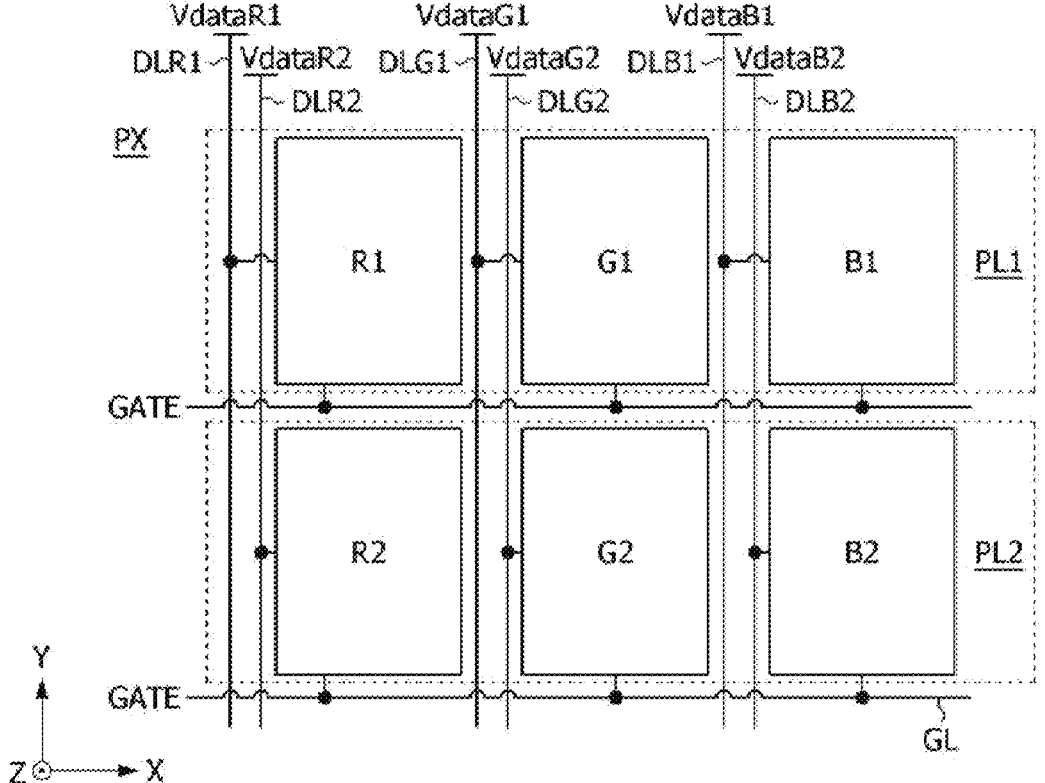
FIGS. 7 to 9 are plan views showing data lines and gate lines connected to pixels according to an embodiment of the present disclosure.

FIG. 7 is a plan view schematically showing the structure of a pixel PX according to an embodiment of the present disclosure. The unit pixel PX shown in FIG. 7 may be repeated along the row direction (X-axis direction) and the column direction (Y-axis direction) in the display area AA of the display panel PN. In FIG. 7, the gate signal GATE may include one or more gate signals, for example, the first to third gate signals GATE1, GATE2, and GATE3 shown in FIGS. 5A to 6B, but the present disclosure is not limited thereto.

With reference to FIG. 7, the pixel PX includes a first sub-pixel R1 of the first color, a second sub-pixel R2 of the first color, a first sub-pixel G1 of the second color, a second sub-pixel G2 of the second color, a first sub-pixel B1 of the third color, and a second sub-pixel B2 of the third color. The first color, second color, and third color may be red, green, and blue, respectively, but the present disclosure is not limited thereto.

Since two sub-pixels are arranged for each color within a unit pixel PX, it is advantageous for the repair process of a defective sub-pixel. For example, when one light-emitting element or driving element is found to be defective among the two sub-pixels R1 and R2 of the first color, the corresponding pixel PX may be driven normally by performing a repair process of appropriately adjusting the luminance of other light-emitting element(s) disposed in the two sub-pixels R1 and R2 of the first color. A method of adjusting the luminance of a sub-pixel may use an optical compensation scheme. For example, the compensation circuit in the timing controller TC may compensate for the luminance of each sub-pixel by adding or multiplying a luminance compensation value for compensating for the luminance of a defective sub-pixel to or by the pixel data to be written in another sub-pixel of the same color. The luminance characteristics of each sub-pixel may be measured by using camera shooting results for the pixels. This compensation circuit may compensate for the luminance for each sub-pixel by using a look-up table in which compensation values preset for individual sub-pixels are listed.

To reduce the length of the pixel PX in the row direction (X-axis direction), first and second sub-pixels for each color may be arranged along the column direction (Y-axis direction). The luminous efficiency of the first color light-emitting element may be worse than that of the second and third color light-emitting elements. In consideration of this, the light-emitting element of the first color may be implemented as a larger light-emitting element chip than the light-emitting element of the second and third colors.

The first and second sub-pixels R1 and R2 of the first color are arranged adjacent to each other in the column direction (Y-axis direction). The first sub-pixel R1 of the first color may be disposed on the first pixel line PL1. The second sub-pixel R2 of the first color may be disposed on the second pixel line PL2 under the first pixel line PL1. The first sub-pixel G1 of the second color is disposed on the first pixel line PL1 so as to be adjacent to the first sub-pixel R1 of the first color in the row direction (X-axis direction). The second sub-pixel G2 of the second color may be disposed on the second pixel line PL2 so as to be adjacent to the first sub-pixel G1 of the second color in the column direction (Y-axis direction). The first and second sub-pixels G1 and G2 of the second color are adjacent to each other in the column direction (Y-axis direction).

The first sub-pixel B1 of the third color is disposed on the first pixel line PL1 so as to be adjacent to the first sub-pixel G1 of the second color in the row direction (X-axis direction). The second sub-pixel B2 of the third color is disposed on the second pixel line PL2 so as to be adjacent to the first sub-pixel B1 of the third color in the column direction (Y-axis direction). The first and second sub-pixels B1 and B2 of the third color are adjacent to each other in the column direction (Y-axis direction).

One data line and one or more gate lines may be connected to the compensation circuit 500 of the sub-pixels R1, R2, G1, G2, B1 and B2.

When a plurality of gate signals are applied to each of the sub-pixels R1, R2, G1, G2, B1 and B2, gate lines to which gate signals are independently applied are connected to the sub-pixels R1, R2, G1, G2, B1 and B2 on the first and second pixel lines PL1 and PL2. For example, the first gate line to which the first gate signal GATE1 is applied may be connected to the sub-pixels R1, R2, G1, G2, B1 and B2, and the second gate line to which the second gate signal GATE2 is applied may be connected to the sub-pixels R1, R2, G1, G2, B1 and B2. Additionally, the third gate line to which the third gate signal GATE3 is applied may be connected to the sub-pixels R1, R2, G1, G2, B1 and B2.

The data driver DD converts pixel data received from the timing controller TC into a data voltage suitable for driving sub-pixels. The data driver DD may convert pixel data of the first color to be written to the first sub-pixel R1 of the first color and pixel data of the first color to be written to the second sub-pixel R2 of the first color respectively to first-first and first-second data voltages VdataR1 and VdataR2 and output them. The data driver DD may convert pixel data of the second color to be written to the first sub-pixel G1 of the second color and pixel data of the second color to be written to the second sub-pixel G2 of the second color respectively to second-first and second-second data voltages VdataG1 and VdataG2 and output them. The data driver DD may convert pixel data of the third color to be written to the first sub-pixel B1 of the third color and pixel data of the third color to be written to the second sub-pixel B2 of the third color respectively to third-first and third-second data voltages VdataB1 and VdataB2 and output them.

The data lines DLR1 to DLB2 cross the gate line GL. The data lines DLR1 to DLB2 may be independently connected for each sub-pixel. The first sub-pixel R1 of the first color is connected to the first-first data line DLR1 and is charged with the first-first data voltage VdataR1 supplied through the first-first data line DLR1. The second sub-pixel R2 of the first color is connected to the first-second data line DLR2 and is charged with the first-second data voltage VdataR2 supplied through the first-second data line DLR2. Since the data lines DLR1 and DLR2 connected to the first and second sub-pixels R1 and R2 of the first color are separated, the first and second sub-pixels R1 and R2 may be charged with different data voltages VdataR1 and VdataR2.

The first sub-pixel G1 of the second color is connected to the second-first data line DLG1 and is charged with the second-first data voltage VdataG1 supplied through the second-first data line DLG1. The second sub-pixel G2 of the second color is connected to the second-second data line DLG2 and is charged with the second-second data voltage VdataG2 supplied through the second-second data line DLG2. Since the data lines DLG1 and DLG2 connected to the first and second sub-pixels G1 and G2 of the second color are separated, the first and second sub-pixels G1 and G2 may be charged with different data voltages VdataG1 and VdataG2.

The first sub-pixel B1 of the third color is connected to the third-first data line DLB1 and is charged with the third-first data voltage VdataB1 supplied through the third-first data line DLB1. The second sub-pixel B2 of the third color is connected to the third-second data line DLB2 and is charged with the third-second data voltage VdataB2 supplied through the third-second data line DLB2. Since the data lines DLB1 and DLB2 connected to the first and second sub-pixels B1 and B2 of the third color are separated, the first and second sub-pixels B1 and B2 may be charged with different data voltages VdataB1 and VdataB2. In order words, in the embodiment of FIG. 7, each of the two sub-pixels of the same color may be independently driven.

Figure 8:
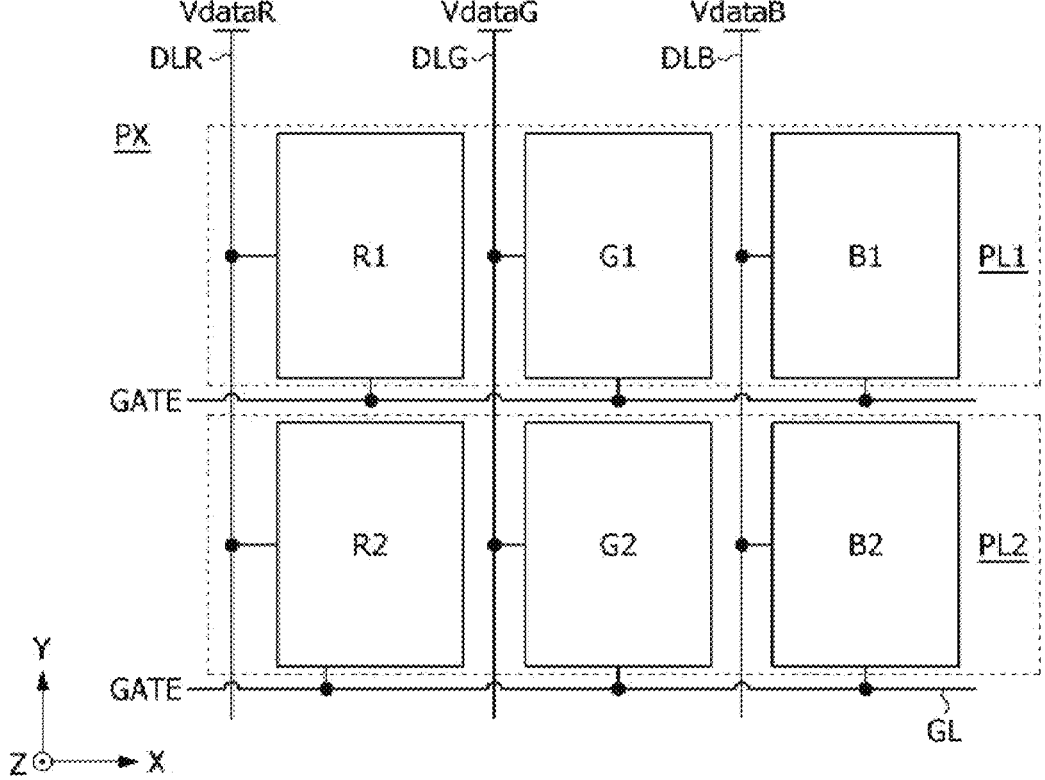

With reference to FIG. 8, the data lines DLR, DLG and DLB may be commonly connected to sub-pixels of the same color and may be separated between sub-pixels of different colors.

The first and second sub-pixels R1 and R2 of the first color are connected to the first data line DLR and are simultaneously charged with the first data voltage VdataR supplied through the first data line DLR.

The first and second sub-pixels G1 and G2 of the second color are connected to the second data line DLG and are simultaneously charged with the second data voltage VdataG supplied through the second data line DLG. The first and second sub-pixels B1 and B2 of the third color are connected to the third data line DLB and are simultaneously charged with the third data voltage VdataB supplied through the third data line DLB.

Figure 9:
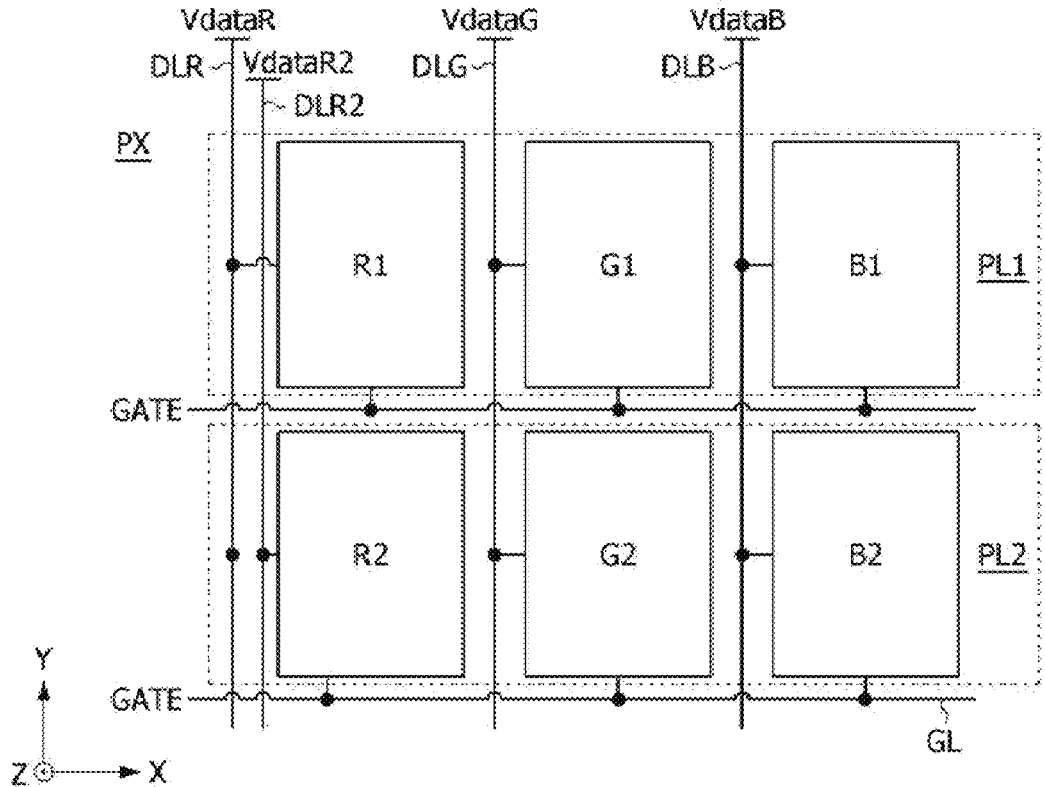

With reference to FIG. 9, the first sub-pixel R1 of the first color is connected to the first-first data line DLR1 and is charged with the first-first data voltage VdataR1 supplied through the first-first data line DLR1. The second sub-pixel R2 of the first color is connected to the first-second data line DLR2 and is charged with the first-second data voltage VdataR2 supplied through the first-second data line DLR2. Since the data lines DLR1 and DLR2 connected to the first and second sub-pixels R1 and R2 of the first color are separated, the first and second sub-pixels R1 and R2 may be charged with different data voltages VdataR1 and VdataR2 to thereby emit light with different luminance.

The first and second sub-pixels G1 and G2 of the second color are connected to the second data line DLG and is charged with the second data voltage VdataG supplied through the second data line DLG. The first and second sub-pixels B1 and B2 of the third color are connected to the third data line DLB and is charged with the third data voltage VdataG supplied through the third data line DLB.

At least one of the sub-pixels R1, R2, G1, G2, B1 and B2 shown in FIGS. 7 to 9 may include light-emitting elements LD1 and LD2 connected in parallel as shown in FIG. 6A or 6B. Each of the sub-pixels R1, R2, G1, G2, B1 and B2 may include the light-emitting elements LD1 and LD2 shown in FIG. 6A or 6B, without being limited thereto. For example, each of the sub-pixels R1 and R2 of the first color may include the light-emitting element LD shown in FIG. 5A or 5B, and each of the sub-pixels G1, G2, B1 and B2 of the second color and third color may include the light-emitting elements LD1 and LD2 shown in FIG. 6A or 6B.

FIGS. 10A to 14C are diagrams illustrating a repair method for a display panel according to an embodiment of the present disclosure. In FIGS. 10A to 14C, the first and second sub-pixels SP1 and SP2 may be sub-pixels of the same color. The first sub-pixel SP1 may be a sub-pixel of a pixel (Pixel(N)) disposed on the first pixel line PL1, and the second sub-pixel SP2 may be a sub-pixel of a pixel (Pixel (N+1)) disposed on the second pixel line PL2, without being limited thereto. The first and second sub-pixels SP1 and SP2 may emit light of the same color and may be adjacent to each other in the column direction (Y-axis direction) of the display panel, without being limited thereto.

The first sub-pixel SP1 may include the first-first and first-second light-emitting elements LD11 and LD12 connected in parallel. The second sub-pixel SP2 may include the second-first and second-second light-emitting elements LD21 and LD22 connected in parallel.

As shown in FIGS. 6A to 14C, the first sub-pixel SP1 may include a first driving element DT that supplies a current to the first-first and first-second light-emitting elements LD11 and LD12, a first-first switch element M1 that switches the current path between the pixel driving voltage VDD and the cathode voltage VSS, a first-second switch element M2 connected between the anode and cathode electrodes of the first-first and first-second light-emitting elements LD11 and LD12, and a first compensation circuit 500 connected to the first driving element DT, first-first switch element M1, and first-second switch element M2. The second sub-pixel SP2 may include a second driving element DT that supplies a current to the second-first and second-second light-emitting elements LD21 and LD22, a second-first switch element M1 that switches the current path between the pixel driving voltage VDD and the cathode voltage VSS, a second-second switch element M2 connected between the anode and cathode electrodes of the second-first and second-second light emitting elements LD21 and LD22, and a second compensation circuit 500 connected to the second driving element DT, second-first switch element M1, and second-second switch element M2.

The welding portions WEL disposed respectively at the ends of the first cathode line CL1 extended from the first sub-pixel SP1 and the second cathode line CL2 extended from the second sub-pixel SP2 may each include metal layers that overlap each other with an insulating layer interposed therebetween, and may be selectively connected in the welding process.

FIGS. 10A to 12C assume a case where at least one of the first-first and first-second light-emitting elements LD11 and LD12 of the first sub-pixel SP1 is defective, and the second-first and second-second light-emitting elements LD21 and LD22 of the second sub-pixel SP2 are capable of being normally driven to emit light. Since the first-first and first-second light-emitting elements LD11 and LD12 are connected in parallel, a dark point and a brightness point do not occur simultaneously in the first-first and first-second light-emitting elements LD11 and LD12.

In the repair method, it may be examined whether sub-pixels are defective one or more times. For example, while all pixels of the display panel are driven, a dark point and bright point of each sub-pixel may be examined by using a high-resolution camera or a luminance meter.

Figure 10A:
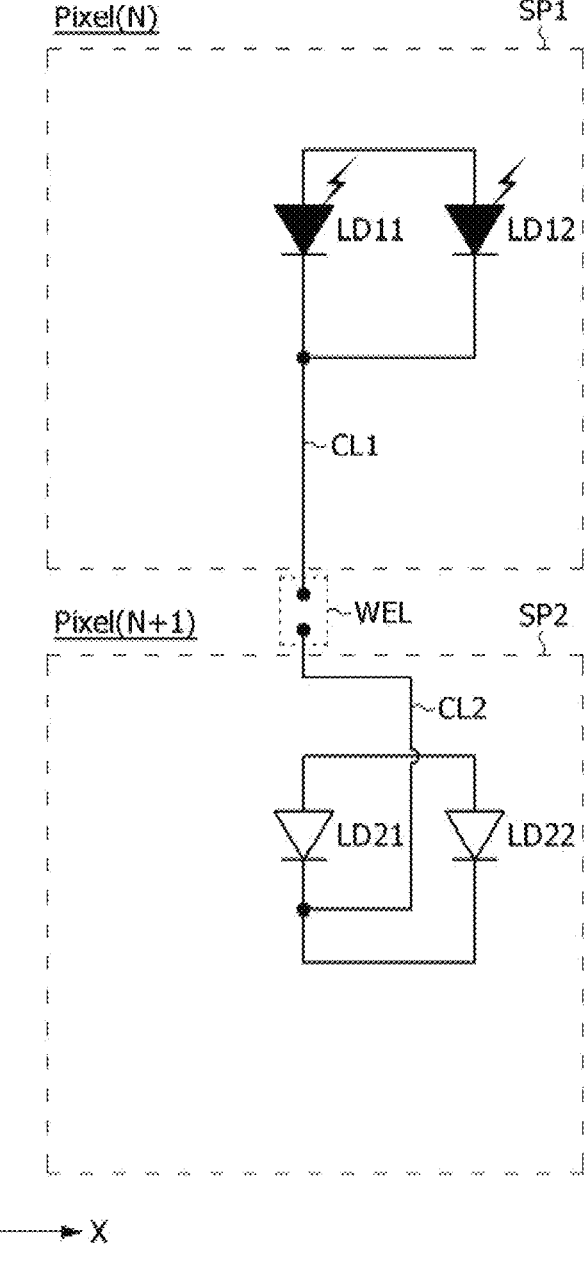
FIGS. 10A to 14C are diagrams illustrating examples of a repair method for a display panel according to an embodiment of the present disclosure.
Figure 10B:
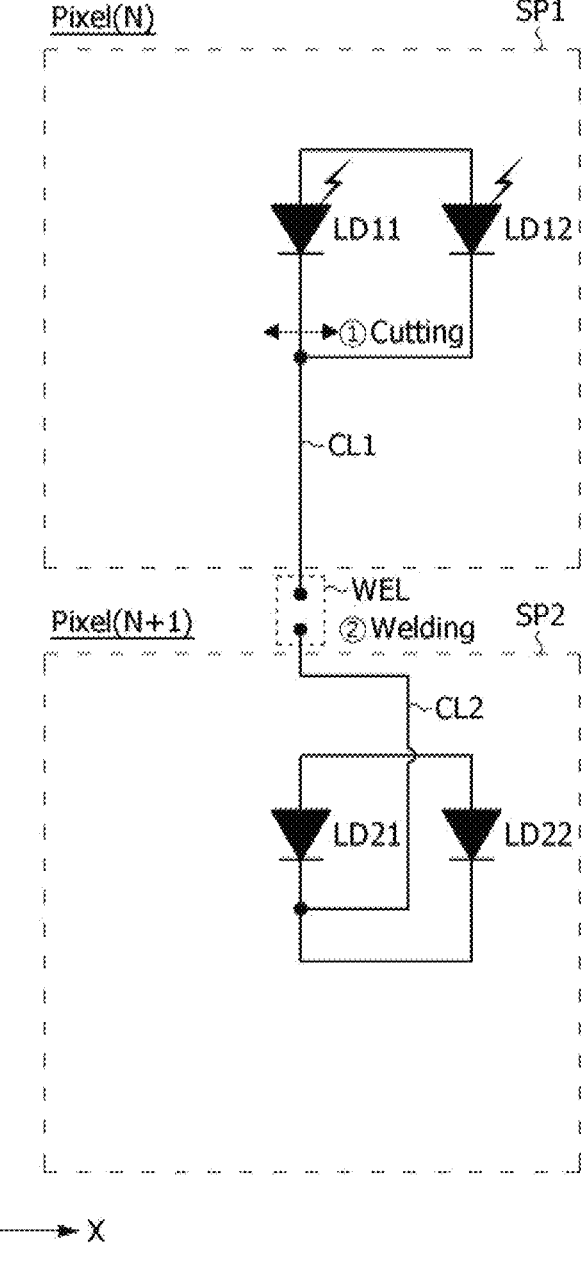
Figure 10C:
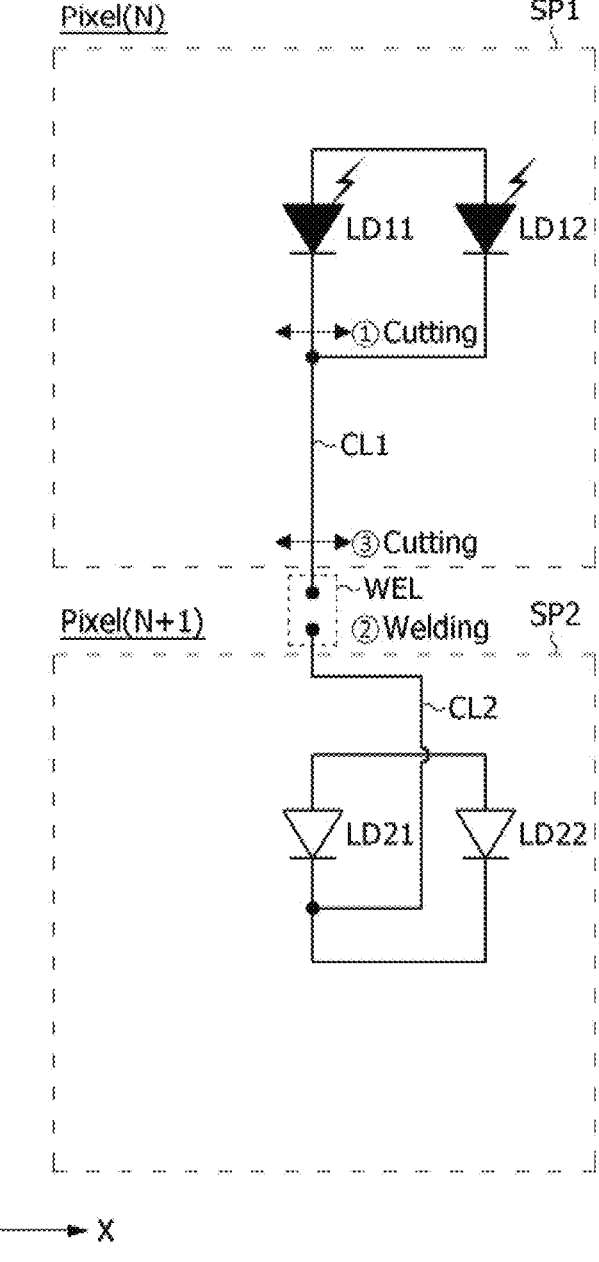

FIGS. 10A to 10C are diagrams illustrating steps of a repair process applied when both the first-first and first-second light-emitting elements LD11 and LD12 of the first sub-pixel SP1 have a short circuit defect.

The first cathode line CL1 is connected to the cathode electrodes of the first-first and first-second light-emitting elements LD11 and LD12 and is extended toward the second sub-pixel SP2. The second cathode line CL2 may be connected to the cathode electrodes of the second-first and second-second light-emitting elements LD21 and LD22 and may be extended toward the first sub-pixel SP1. The ends of the first and second cathode lines CL1 and CL2 that face each other may overlap at the welding portions WEL with an insulating layer therebetween.

In the initial defect identification process, as shown in FIG. 10A, both the first-first and first-second light-emitting elements LD11 and LD12 of the first sub-pixel SP1 may be initially found to be a dark-point defect. At this time, the second-first and second-second light-emitting elements LD21 and LD22 of the second sub-pixel SP2 may be normally driven and may be identified as a bright point. It may be hard to know which element is defective in the initial defect identification process, and the defective element may be determined based on the results of the first stage repair process as shown in FIG. 10B.

When a defect is initially identified as shown in FIG. 10A, the first stage repair process is performed. As indicated by ① in FIG. 10B, the first cathode line CL1 is cut between the cathode electrode of the first-first light-emitting element LD11 and the cathode electrode of the first-second light-emitting element LD12 of the first sub-pixel SP1, and thus the cathode electrode of the first-first light-emitting element LD11 and the cathode electrode of the first-second light-emitting element LD12 are electrically separated. Next, as shown by ② in FIG. 10B, the welding portion WEL of the first cathode line CL1 extended from the first sub-pixel SP1 and the welding portion WEL of the second cathode line CL2 extended from the second sub-pixel SP2 may be welded and electrically connected to each other. As a result, if all the light-emitting elements LD11, LD12, LD21 and LD22 of the first and second sub-pixels SP1 and SP2 are identified to be a dark point, in the second stage repair process, the first cathode line CL1 is cut between the cathode electrode of the first-second light-emitting element LD12 and the welding portion WEL as shown by ③ in FIG. 10C. At this time, the cathode electrodes of the second-first and second-second light-emitting elements LD21 and LD22 are electrically separated from the cathode electrodes of the first-first and first-second light-emitting elements LD11 and LD12. Consequently, the second-first and second-second light-emitting elements LD21 and LD22 of the second sub-pixel SP2 may be driven normally to emit light. The first-first and first-second light-emitting elements LD11 and LD12 remain as a dark point that does not emit light.

Figure 11A:
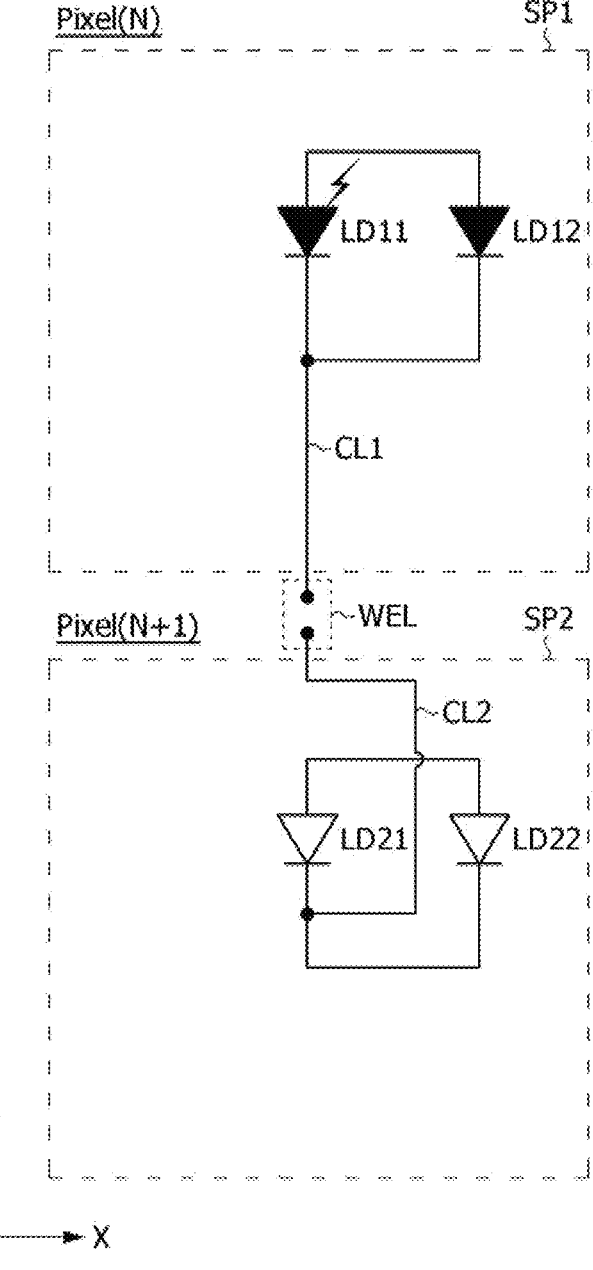
Figure 11B:
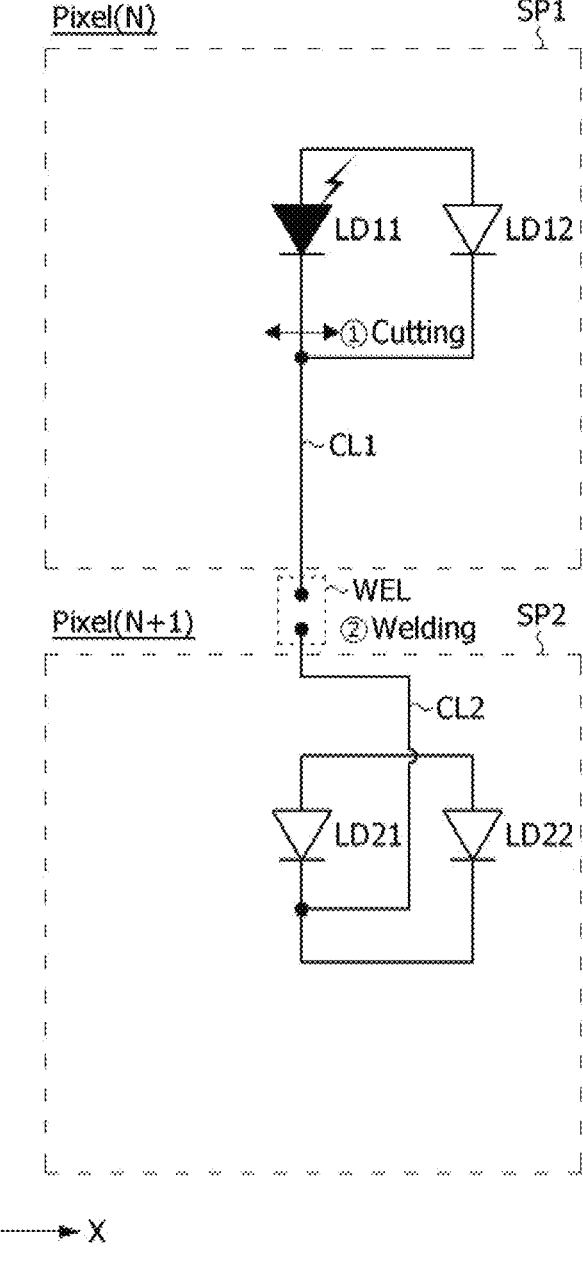
Figure 11C:
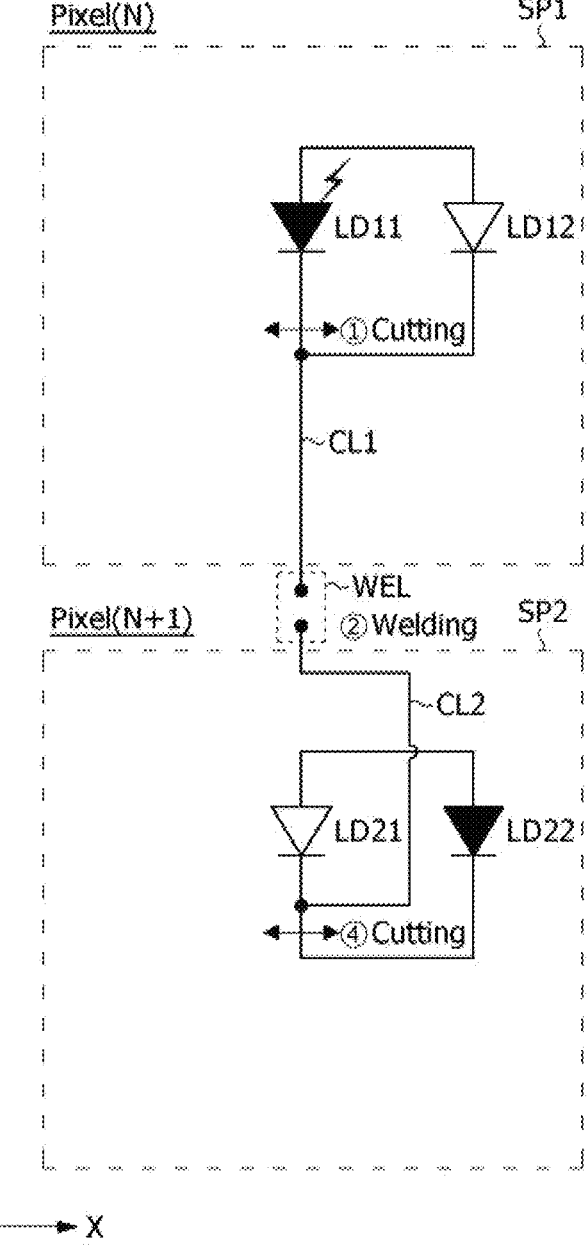

FIGS. 11A to 11C are diagrams illustrating steps of a repair process applied when the first-first light-emitting element LD11 of the first sub-pixel SP1 is short-circuited and the first-second light-emitting element LD12 is a normally driven element.

In the initial defect identification process, as shown in FIG. 11A, both the first-first and first-second light-emitting elements LD11 and LD12 of the first sub-pixel SP1 may be initially found to be a dark-point defect. At this time, the second-first and second-second light-emitting elements LD21 and LD22 of the second sub-pixel SP2 may be normally driven and may be identified as a bright point. It may be hard to know which element is defective in the initial defect identification process, and the defective element may be determined based on the results of the first stage repair process as shown in FIG. 11B.

When a defect is initially identified as shown in FIG. 11A, the repair process is performed. In the first stage repair process, as shown by ① in FIG. 11B, the first cathode line CL1 is cut between the cathode electrode of the first-first light-emitting element LD11 and the cathode electrode of the first-second light-emitting element LD12 of the first sub-pixel SP1, and thus the cathode electrode of the first-first light-emitting element LD11 and the cathode electrode of the first-second light-emitting element LD12 are electrically separated. Next, as shown by ② in FIG. 11B, the welding portion WEL of the first cathode line CL1 extended from the first sub-pixel SP1 and the welding portion WEL of the second cathode line CL2 extended from the second sub-pixel SP2 may be welded and electrically connected to each other. As a result of the first stage repair process, if the first-first light-emitting element LD11 is identified to be a dark point, and each of the first-second, second-first, and second-second light emitting elements LD12, LD21 and LD22 is identified to be a bright point emitting light at 33-percent luminance, in the second stage repair process, as shown by ④ in FIG. 11C, the second cathode line CL2 is cut between the cathode electrode of the second-first light-emitting element LD21 and the cathode electrode of the second-second light-emitting element LD22, so that the corresponding cathode electrodes are electrically separated. At this time, while the cathode electrodes of the first-second and second-first light-emitting elements LD12 and LD21 are electrically connected to each other, these cathode electrodes are electrically separated from the cathode electrodes of the first-first and second-second light-emitting elements LD11 and LD22. As a result, the first-second light-emitting element LD12 and the second-first light-emitting element LD21 of the first sub-pixel SP1 may be driven normally to emit light at the same luminance ratio. The first-first and second-second light-emitting elements LD11 and LD22 remain as a dark point that does not emit light.

After the first stage repair process as shown in FIG. 11B, the first-second, second-first and second-second light-emitting elements LD12, LD21 and LD22 may emit light, but there is a difference in luminance between the sub-pixels SP1 and SP2. For example, when the luminance of the first-first light-emitting element LD11 is 100 percent and the luminance of the second-first and second-second light-emitting elements LD21 and LD22 is 50 percent, the luminance ratio between the sub-pixels SP1 and SP2 may be made to be the same. This is because in a state where the cathode lines CL1 and CL2 of the sub-pixels SP1 and SP2 connected to each other, it is difficult to drive one light-emitting element LD11 connected to one compensation circuit at 100 percent luminance and two light-emitting elements LD21 and LD22 connected to another compensation circuit at 50 percent luminance. Therefore, by performing the second stage repair process as shown in FIG. 11C, one light-emitting element LD12 and one light-emitting element LD12 respectively in the sub-pixels SP1 and SP2 are driven at the same 100 percent luminance, so that the luminance difference between the sub-pixels SP1 and SP2 may be minimized or reduced.

Figure 12A:
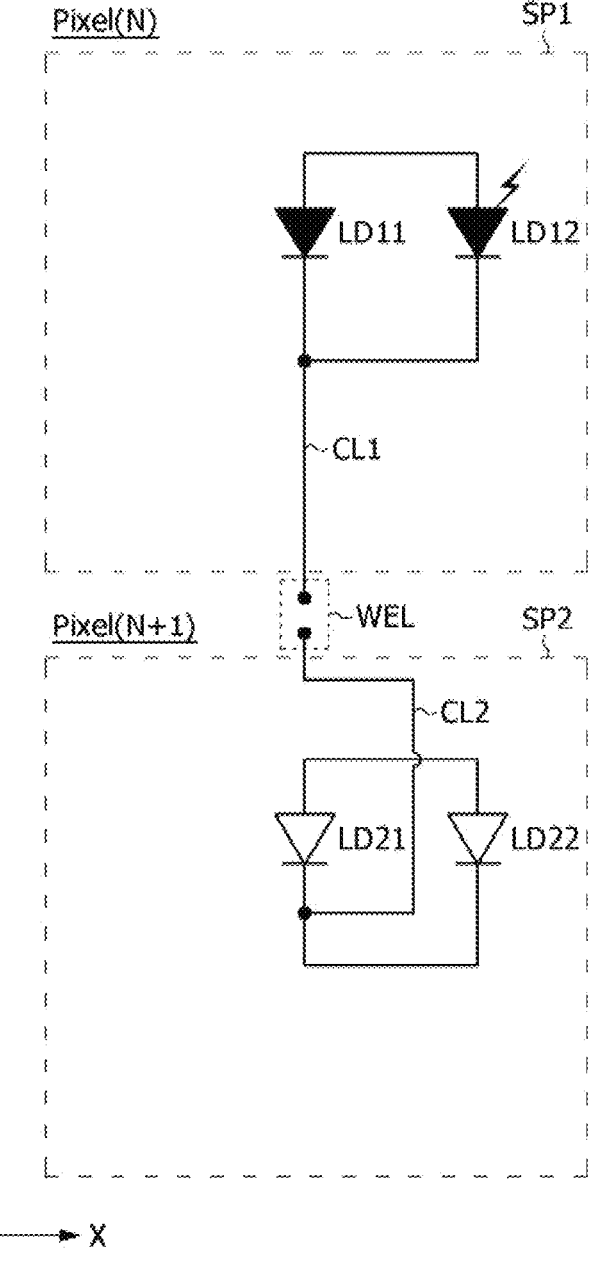
Figure 12B:
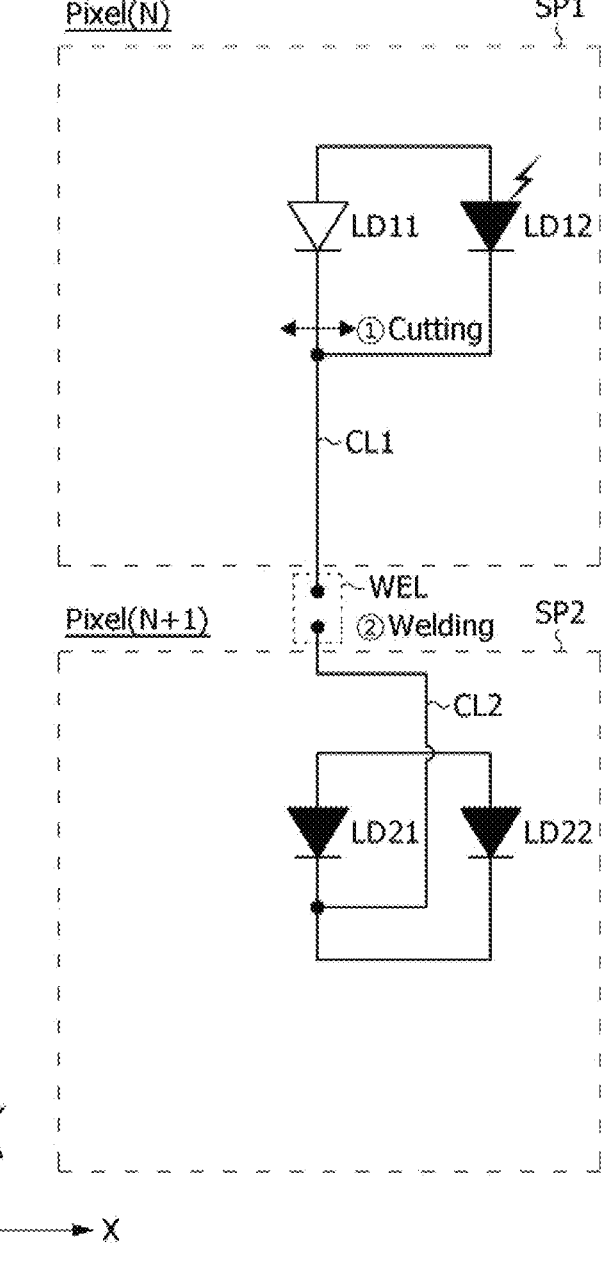
Figure 12C:
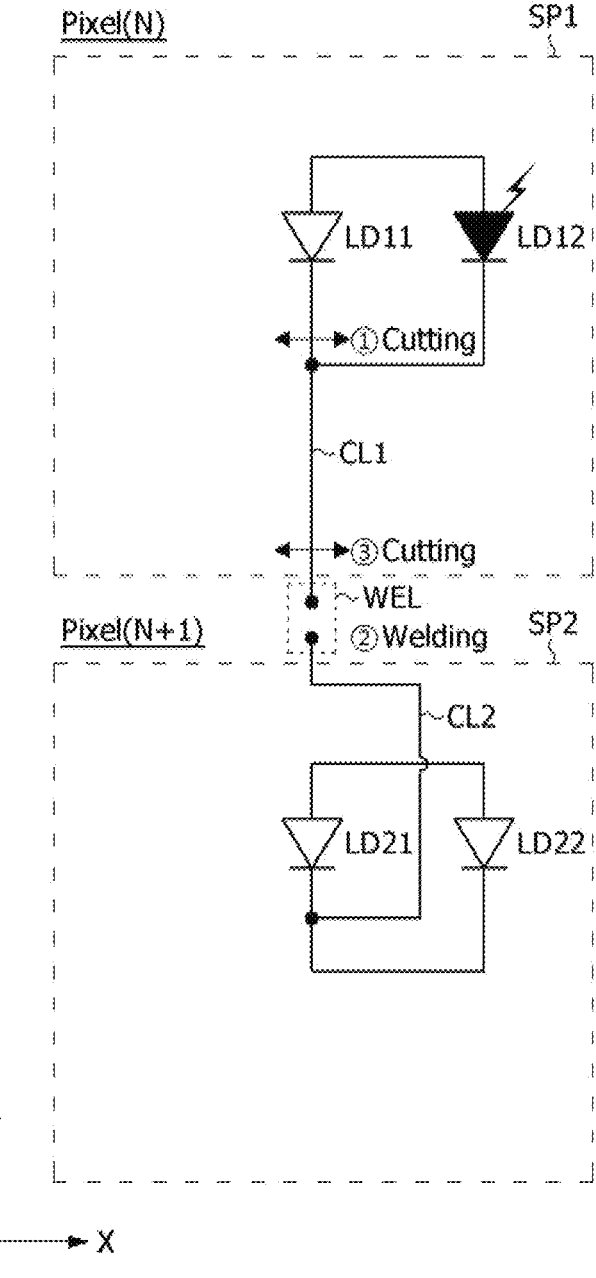

FIGS. 12A to 12C are diagrams illustrating steps of a repair process applied when the first-second light-emitting element LD12 of the first sub-pixel SP1 is short-circuited and the first-first light-emitting element LD11 is a normally driven element.

In the initial defect identification process, as shown in FIG. 12A, both the first-first and first-second light-emitting elements LD11 and LD12 of the first sub-pixel SP1 may be initially found to be a dark-point defect. At this time, the second-first and second-second light-emitting elements LD21 and LD22 of the second sub-pixel SP2 may be normally driven and may be identified as a bright point. It may be hard to know which element is defective in the initial defect identification process, and the defective element may be determined based on the results of the first stage repair process as shown in FIG. 12B.

When a defect is initially identified as shown in FIG. 12A, the first stage repair process is performed. As shown by ① in FIG. 12B, the first cathode line CL1 is cut between the cathode electrode of the first-first light-emitting element LD11 and the cathode electrode of the first-second light-emitting element LD12 of the first sub-pixel SP1, and thus the cathode electrode of the first-first light-emitting element LD11 and the cathode electrode of the first-second light-emitting element LD12 are electrically separated. Next, as shown by ② in FIG. 12B, the cathode lines CL1 and CL2 may be electrically connected to each other at the welding portions WEL where the first cathode line CL1 extended from the first sub-pixel SP1 overlaps with the second cathode line CL2 extended from the second sub-pixel SP2. As a result of the first stage repair process, if the first-second, second-first, and second-second light-emitting elements LD12, LD21 and LD22 are identified as a dark point, and the first-first light emitting element LD11 is identified as a bright point, in the second stage repair process, as shown by ③ in FIG. 12C, the first cathode line CL1 is cut between the cathode electrode of the first-second light-emitting element LD12 and the welding portion WEL. At this time, the cathode electrodes of the second-first and second-second light-emitting elements LD21 and LD22 are electrically separated from the cathode electrode of the first-second light-emitting element LD12. As a result, the cathode lines CL1 and CL2 extended from the sub-pixels SP1 and SP2 are separated, so the first-first light-emitting element LD11 of the first sub-pixel SP1 is driven at 100 percent luminance and the second-first and second-second light-emitting elements LD21 and LD22 of the second sub-pixel SP2 may each emit light at 50 percent luminance. Consequently, the first and second sub-pixels SP1 and SP2 may emit light at the same luminance ratio. The first-second light-emitting element LD12 remains as a dark point that does not emit light.

Figure 13A:
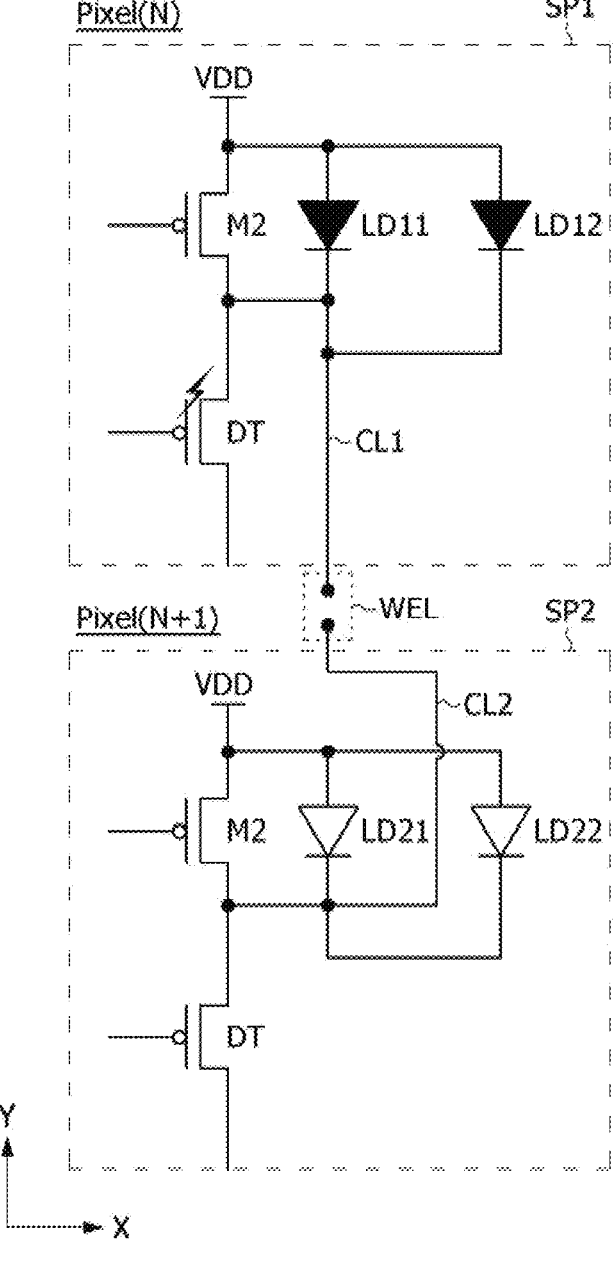
Figure 14A:
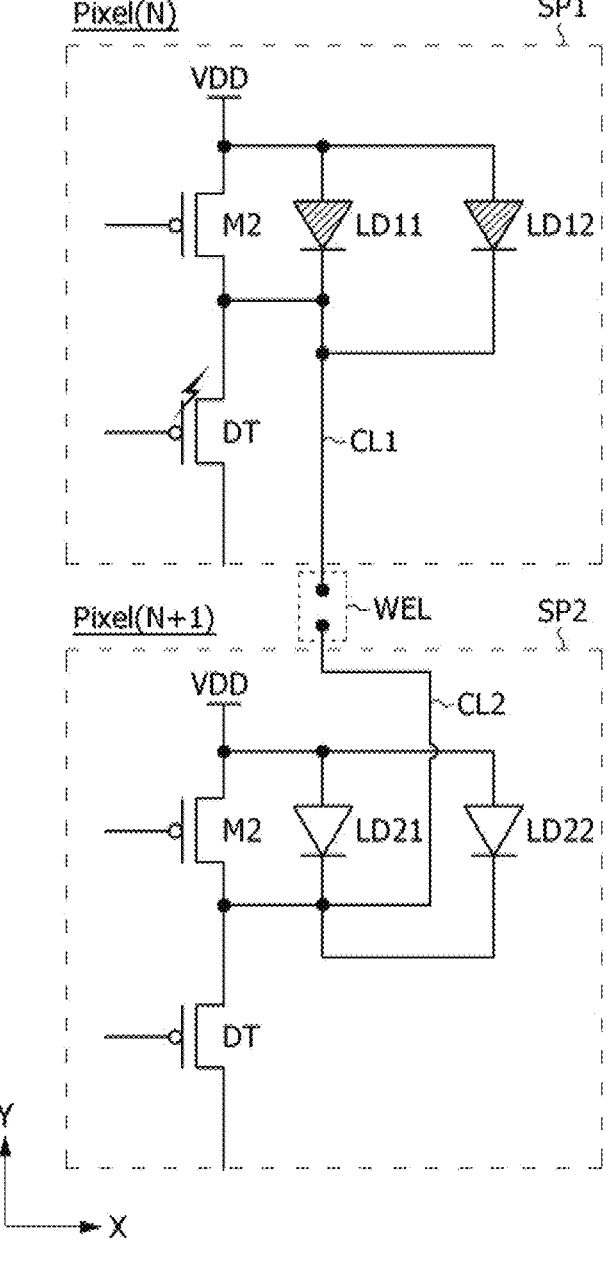

When the transistors of the sub-pixels SP1 and SP2 are defective, a current cannot flow through the light-emitting elements, so they may appear as a dark point as shown in FIG. 13A; or, the amount of current flowing through the light-emitting elements cannot be adjusted, so they may emit light at maximum luminance to appear as a bright point as shown in FIG. 14A. In the case of dark point and bright point defects due to defective transistors, the first stage and second stage repair processes are substantially the same.

Figure 13B:
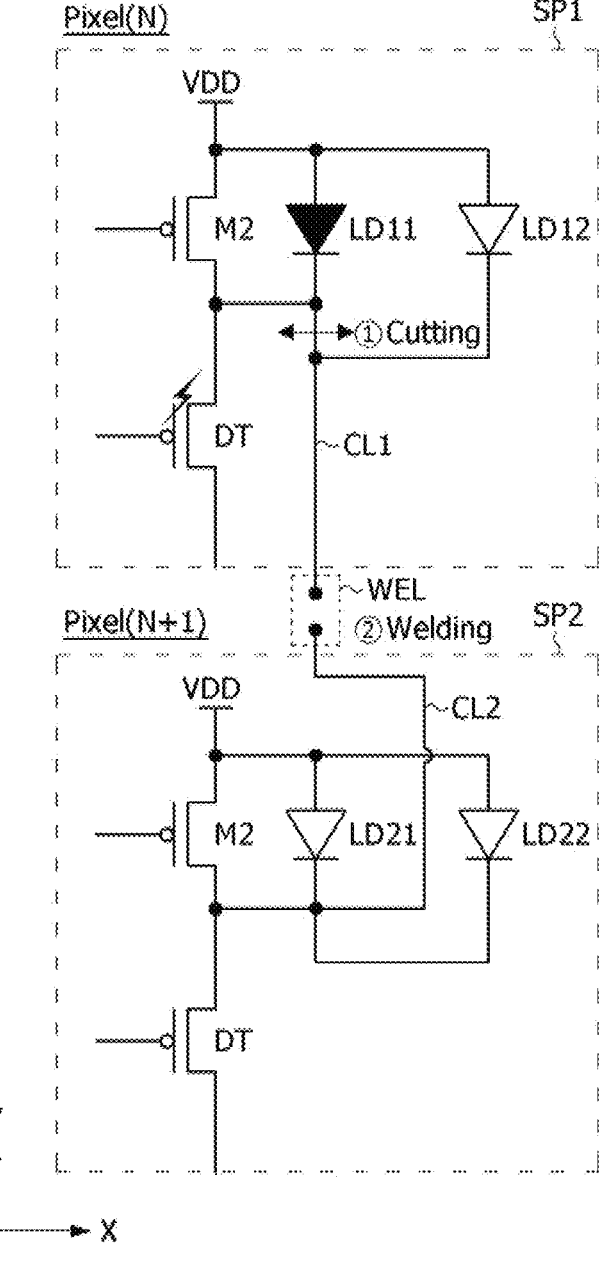
Figure 13C:
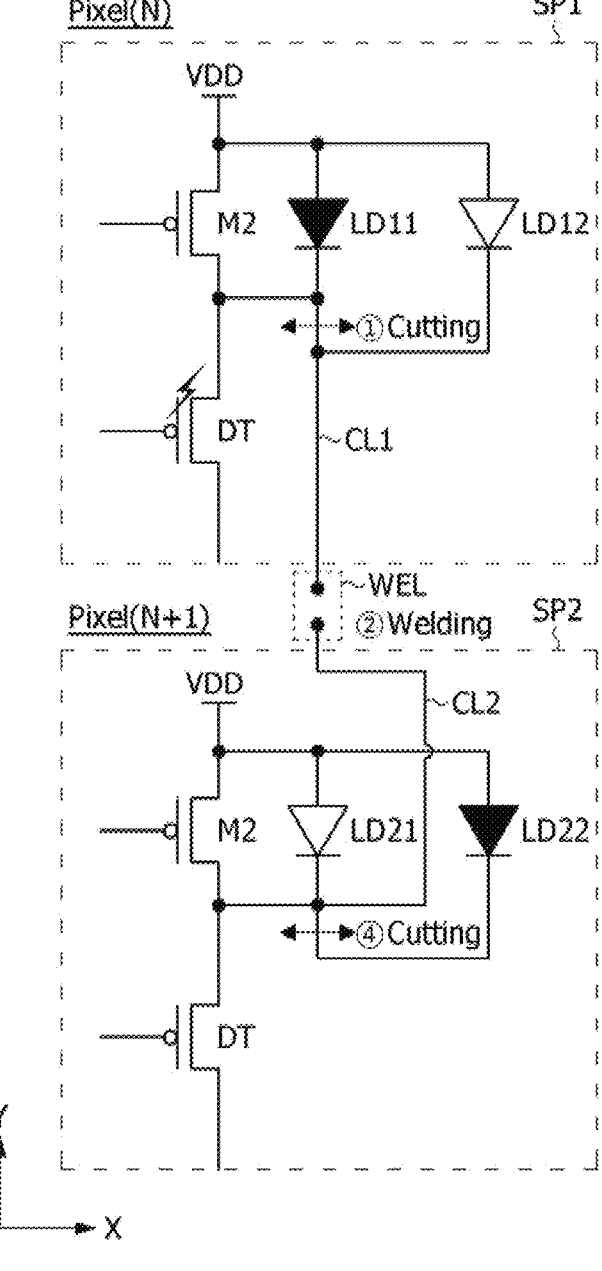

FIGS. 13A to 13C are diagrams illustrating steps of a repair process applied when the transistor, for example, driving element (DT) of the first sub-pixel SP1 is defective and the first sub-pixel SP1 appears as a dark point.

In the initial defect identification process, as shown in FIG. 13A, both the first-first and first-second light-emitting elements LD11 and LD12 of the first sub-pixel SP1 may be initially found to be a dark-point defect. At this time, the second-first and second-second light-emitting elements LD21 and LD22 of the second sub-pixel SP2 may be normally driven and may be identified as a bright point. It may be hard to know which element is defective in the initial defect identification process, and the defective element may be determined based on the results of the first stage repair process as shown in FIG. 13B.

When a defect is initially identified as shown in FIG. 13A, the first stage repair process is performed. As shown by ① in FIG. 13B, the first cathode line CL1 is cut between the cathode electrode of the first-first light-emitting element LD11 and the cathode electrode of the first-second light-emitting element LD12 of the first sub-pixel SP1, and thus the cathode electrode of the first-first light-emitting element LD11 and the cathode electrode of the first-second light-emitting element LD12 are electrically separated. Next, as shown by ② in FIG. 13B, the cathode lines CL1 and CL2 may be electrically connected to each other at the welding portions WEL where the first cathode line CL1 extended from the first sub-pixel SP1 overlaps with the second cathode line CL2 extended from the second sub-pixel SP2. As a result of the first stage repair process, if the first-second, second-first, and second-second light-emitting elements LD12, LD21 and LD22 are identified as a bright point, and the first-first light emitting element LD11 is identified as a dark point, in the second stage repair process, as shown by ④ in FIG. 13C, the second cathode line CL2 is cut between the cathode electrode of the second-first light-emitting element LD21 and the cathode electrode of the second-second light-emitting element LD22. At this time, the cathode electrodes of the first-second and second-first light-emitting elements LD12 and LD21 are electrically connected to each other, and these cathode electrodes are electrically separated from the cathode electrodes of the first-first and second-second light-emitting elements LD11 and LD22. Consequently, the first-second light-emitting element LD12 and the second-first light-emitting element LD21 may be driven normally to emit light at the same luminance ratio. The first-first and second-second light-emitting elements LD11 and LD22 remain as a dark point that does not emit light.

Figure 14B:
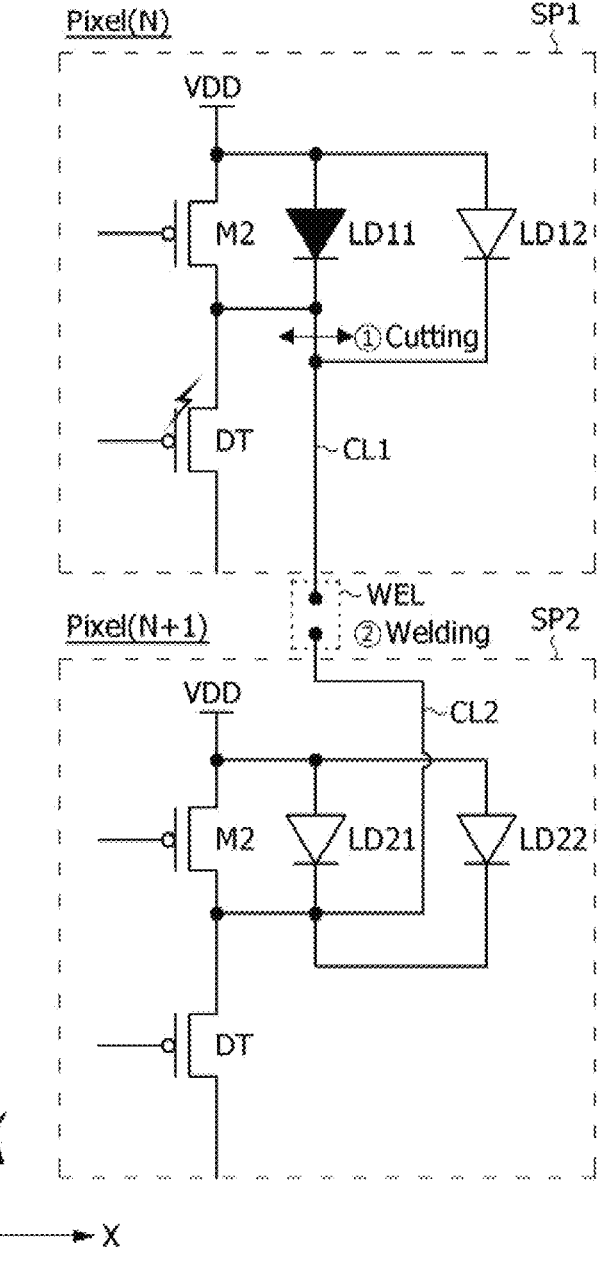
Figure 14C:
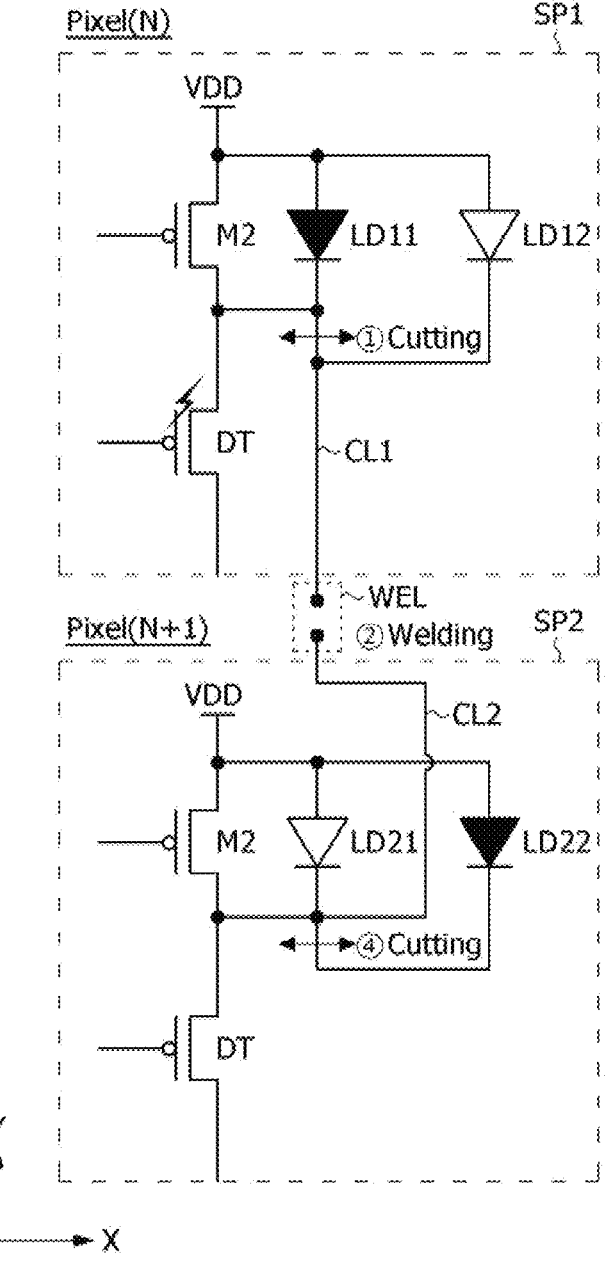

FIGS. 14A to 14C are diagrams illustrating steps of a repair process applied when the first sub-pixel SP1 appears as a bright-point due to a defective transistor, for example, driving element (DT) of the first sub-pixel SP1.

In the initial defect identification process, as shown in FIG. 14A, both the first-first and first-second light-emitting elements LD11 and LD12 of the first sub-pixel SP1 may be initially found to be a bright-point defect. At this time, the second-first and second-second light-emitting elements LD21 and LD22 of the second sub-pixel SP2 may be driven normally but may be identified as a bright point with relatively low luminance. It may be hard to know which element is defective in the initial defect identification process, and the defective element may be determined based on the results of the first stage repair process as shown in FIG. 14B.

When a defect is initially identified as shown in FIG. 14A, the first stage repair process is performed. As shown by ① in FIG. 14B, the first cathode line CL1 is cut between the cathode electrode of the first-first light-emitting element LD11 and the cathode electrode of the first-second light-emitting element LD12 of the first sub-pixel SP1, and thus the cathode electrode of the first-first light-emitting element LD11 and the cathode electrode of the first-second light-emitting element LD12 are electrically separated. Next, as shown by ② in FIG. 14B, the cathode lines CL1 and CL2 may be electrically connected to each other at the welding portions WEL where the first cathode line CL1 extended from the first sub-pixel SP1 overlaps with the second cathode line CL2 extended from the second sub-pixel SP2. As a result of the first stage repair process, if the first-second, second-first, and second-second light-emitting elements LD12, LD21 and LD22 are identified as a bright point, and the first-first light emitting element LD11 is identified as a dark point, in the second stage repair process, as shown by ④ in FIG. 14C, the second cathode line CL2 is cut between the cathode electrode of the second-first light-emitting element LD21 and the cathode electrode of the second-second light-emitting element LD22. At this time, the cathode electrodes of the first-second and second-first light-emitting elements LD12 and LD21 are electrically connected to each other, and these cathode electrodes are electrically separated from the cathode electrodes of the first-first and second-second light-emitting elements LD11 and LD22. Consequently, the first-second light-emitting element LD12 and the second-first light-emitting element LD21 may be driven normally to emit light at the same luminance ratio. The first-first and second-second light-emitting elements LD11 and LD22 remain as a dark point that does not emit light.

In the case where the first and second sub-pixels SP1 and SP2 do not have a defect and are not repaired, the cathode electrodes of the first-first and first-second light-emitting elements LD11 and LD12 are connected to the first cathode line CL1, and the cathode electrodes of the second-first and second-second light-emitting elements LD21 and LD22 are connected to the second cathode line CL2. On the other hand, in the case where the first sub-pixel SP1 is repaired due to a defect in the transistors of the pixel circuit or light-emitting element chip, as shown in FIGS. 10C, 11C, 12C, 13C and 14C, the first cathode line CL1 may be connected to at least one of the cathode electrodes of the first-first and first-second light-emitting elements, and the second cathode line CL2 may be connected to at least one of the cathode electrodes of the second-first and second-second light-emitting elements LD21 and LD22. Depending on whether the first sub-pixel is defective, the first cathode line CL1 may be connected to one or more of the cathode electrodes of the first-first and first-second light-emitting elements LD11 and LD12, and may be connected to the second cathode line CL2 extended from the second sub-pixel SP2.

As shown in FIGS. 6A, 6B, 10C, 11C, 12C, 13C and 14C, the second switch element M2 of the first sub-pixel SP1 may be connected to the anode electrode of the first-first light-emitting element LD11 and the anode electrode of the first-second light-emitting element LD12, and may be connected to at least one of the cathode electrode of the first-first light-emitting element LD11 and the cathode electrode of the first-second light-emitting element LD12. The second switch element M2 of the second sub-pixel SP2 may be connected to the anode electrode of the second-first light emitting element LD21 and the anode electrode of the second-second light emitting element LD22, and may be connected to at least one of the cathode electrode of the second-first light-emitting element LD21 and the cathode electrode of the second-second light-emitting element LD22.

As shown in FIGS. 10C, 11C, 12C, 13C and 14C, as a result of the repair process, light-emitting elements having turned into a dark point are not present in a row between neighboring sub-pixels. At least one of the pixel structures that have completed the repair process, for example, those shown in FIGS. 10C, 11C, 12C, 13C, and 14C may be disposed on the display panel after product shipment.

Figure 15:
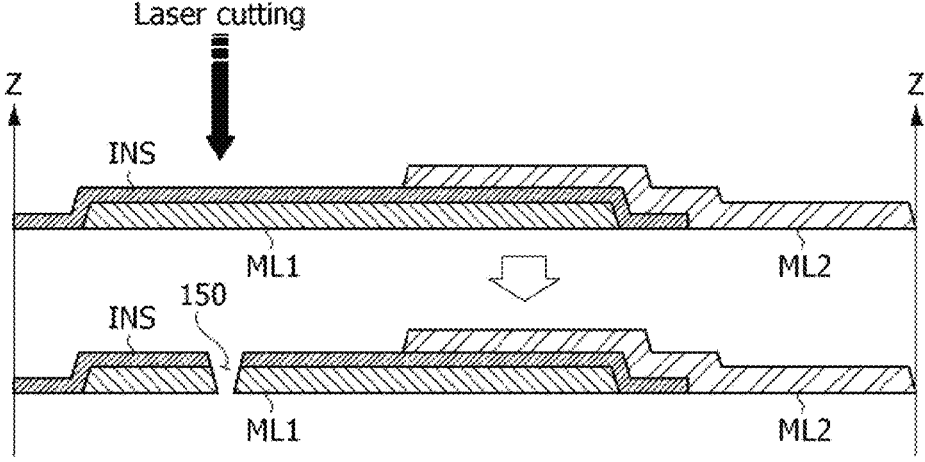
FIG. 15 is a cross-sectional view showing an example of a laser cutting method.
Figure 16:
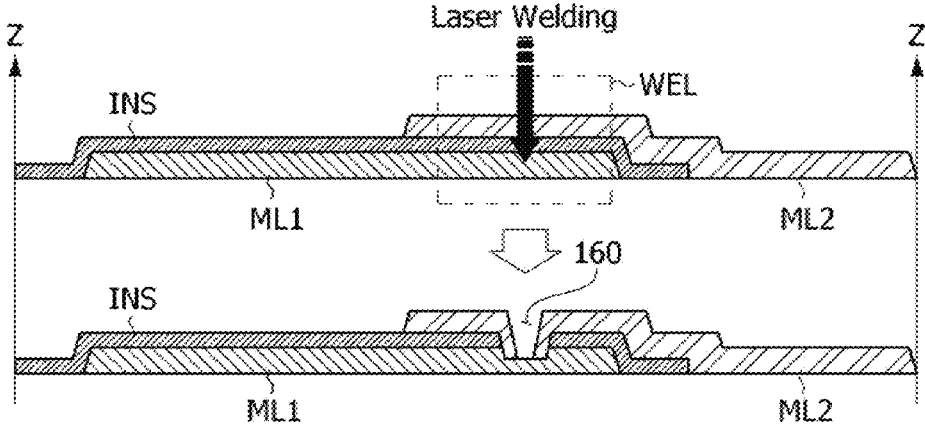
FIG. 16 is a cross-sectional view showing an example of a laser welding method.

The repair process can be performed by irradiating a laser beam onto the display panel to selectively remove metal at a desired position (laser cutting) or by connecting different layers of metal (laser welding). An example of a laser cutting method and a laser welding method will be described in conjunction with FIGS. 15 and 16. In FIGS. 15 and 16, 'ML1' and 'ML2' may indicate metal patterns of the first and second cathode lines CL1 and CL2 extended from sub-pixels of the same color.

The first metal pattern ML1 and the second metal pattern ML2 are electrically separated with an insulating layer INS interposed therebetween. When viewed in the thickness direction (Z) of the display panel, the first metal pattern ML1 and the second metal pattern ML2 may overlap in the welding portion WEL with the insulating layer INS interposed therebetween. The insulating layer INS may include an organic insulating layer and/or an inorganic insulating layer.

FIG. 15 is a cross-sectional view showing an example of a laser cutting method.

With reference to FIG. 15, the laser repair equipment radiates a laser beam to the display panel at cutting positions shown in FIGS. 10B and 10C, 11B and 11C, 12B and 12C, 13B and 13C, and 14B and 14C. At the cutting position, the first metal pattern ML1 and the second metal pattern ML2 do not overlap. The insulating layer INS and the first metal pattern (ML1) may be melted and become insulated from each other at the cutting position due to the energy of the laser beam.

FIG. 16 is a cross-sectional view showing an example of a laser welding method.

With reference to FIG. 16, the laser repair equipment radiates a laser beam to the display panel at welding positions shown in FIGS. 10B and 10C, 11B and 11C, 12B and 12C, 13B and 13C, and 14B and 14C. At the welding position, the first and second metal patterns ML1 and ML2 overlap with the insulating layer INS interposed therebetween. The insulating layer INS and metal patterns ML1 and ML2 are melted at the welding location due to the energy of the laser beam. At this time, the overlapping metal patterns ML1 and ML2 at the welding position may be connected to each other. On the other hand, the metal patterns ML1 and ML2 may be connected at the welding position by using a laser CVD equipment that fills a hole penetrating the insulating layer INS with metal such as tungsten at the welding position.

According to one or more embodiments of the present disclosure, the display device may be applied to mobile devices, video phones, smart watches, watch phones, wearable device, foldable device, rollable device, bendable device, flexible device, curved device, sliding device, variable device, electronic organizer, electronic books, portable multimedia players (PMPs), personal digital assistants (PDAs), MP3 players, mobile medical devices, desktop PCs, laptop PCS, netbook computers, workstations, navigations, vehicle navigations, vehicle display devices, vehicle devices, theater devices, theater display devices, televisions, wallpaper devices, signage devices, game devices, laptops, monitors, cameras, camcorders, and home appliances, etc. Additionally, the display device according to one or more embodiments of the present disclosure may be applied to organic light emitting lighting devices or inorganic light emitting lighting devices.

The aspects to be achieved by the present disclosure, the means for achieving the aspects, and effects of the present disclosure described above do not specify essential features of the claims, and thus, the scope of the claims is not limited to the disclosure of the present disclosure.

It will be apparent to those skilled in the art that various modifications and variations can be made in the display device of the present disclosure without departing from the technical concept or scope of the disclosure. Thus, it is intended that the present disclosure cover the modifications and variations of this disclosure including those of the appended claims and their equivalents.

The various embodiments described above can be combined to provide further embodiments. Aspects of the embodiments can be modified, if necessary to employ concepts of the various embodiments to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display panel, comprising:
a first sub-pixel including a first-first light-emitting element and a first-second light-emitting element;
a second sub-pixel including a second-first light-emitting element and a second-second light-emitting element;
a first cathode line connected to at least one cathode electrode among a cathode electrode of the first-first light-emitting element or a cathode electrode of the first-second light emitting element, and extended toward the second sub-pixel; and
a second cathode line connected to at least one cathode electrode among a cathode electrode of the second-first light-emitting element or a cathode electrode of the second-second light emitting element, and extended toward the first sub-pixel,
wherein the first cathode line and the second cathode line partially overlap with each other, and
wherein the cathode electrode of the first-first light-emitting element and the cathode electrode of the first-second light-emitting element are electrically separated from one another.

2. The display panel of claim 1, wherein the first cathode line and the second cathode line are connected to or separated from each other at a portion where the first cathode line and the second cathode line overlap.

3. The display panel of claim 1, wherein the first cathode line and the second cathode line are separated and insulated from each other at a portion where the first cathode line and the second cathode line do not overlap.

4. The display panel of claim 1, wherein:
an anode electrode of the first-first light-emitting element is connected to an anode electrode of the first-second light-emitting element; and
an anode electrode of the second-first light-emitting element is connected to an anode electrode of the second-second light-emitting element.

5. The display panel of claim 1, wherein the first sub-pixel includes:
a first driving transistor that supplies a current to the first-first light-emitting element and the first-second light-emitting element;
a first-first switch transistor that switches a current path between a pixel driving voltage and a cathode voltage; and
a first-second switch transistor that is connected to an anode electrode of the first-first light-emitting element and an anode electrode of the first-second light-emitting element, and is connected to at least one of the cathode electrode of the first-first light-emitting element or the cathode electrode of the first-second light-emitting element, and
wherein the second sub-pixel includes:
a second driving transistor that supplies a current to the second-first light-emitting element and the second-second light-emitting element;
a second-first switch transistor that switches a current path between the pixel driving voltage and the cathode voltage; and a second-second switch transistor that is connected to an anode electrode of the second-first light-emitting element and an anode electrode of the second-second light-emitting element, and is connected to at least one of the cathode electrode of the second-first light-emitting element or the cathode electrode of the second-second light-emitting element.

6. The display panel of claim 5, wherein the first-second switch transistor is connected between a pixel driving voltage line and the first driving transistor, and wherein the second-second switch transistor is connected between the pixel driving voltage line and the second driving transistor.

7. The display panel of claim 1, wherein;

the first cathode line and the second cathode line are electrically separated.

8. The display panel of claim 1, wherein:

the first cathode line and the second cathode line are electrically connected; and the cathode electrode of the first-second light-emitting element and the cathode electrode of the second-first light-emitting element are electrically connected to each other.

9. The display panel of claim 8, wherein the cathode electrode of the second-first light-emitting element are electrically separated from the cathode electrode of the second-second light-emitting element.

10. The display panel of claim 1, wherein:

the first cathode line and the second cathode line are electrically separated; and the cathode electrode of the second-first light-emitting element and the cathode electrode of the second-second light-emitting element are electrically connected to each other.

11. The display panel of claim 1, wherein the first cathode line and the second cathode line are disposed with an insulating layer interposed therebetween.

12. The display panel of claim 11, further comprising a hole penetrating the insulating layer, and the first cathode line and the second cathode line are connected to each other through the hole.

13. The display panel of claim 1, wherein the first sub-pixel and the second sub-pixel emit light of a same color and are adjacent to each other.

14. A repair method for a display panel, the method comprising:

electrically separating a cathode electrode of a first-first light-emitting element of a first sub-pixel from a cathode electrode of a first-second light emitting element of the first sub-pixel; and electrically connecting a first cathode line extended from the first sub-pixel to a second cathode line extended from a second sub-pixel, wherein the first cathode line is connected to at least one cathode electrode among cathode electrodes of the first-first or a first-second light-emitting elements and is extended toward the second sub-pixel, and wherein the second cathode line is connected to at least one cathode electrode among cathode electrodes of a second-first or a second-second light-emitting elements of the second sub-pixel and is extended toward the first sub-pixel.

15. The repair method of claim 14, wherein the first cathode line is electrically separated from the first-first light-emitting element, and the repair method further comprises electrically separating the cathode electrode of the first-second light-emitting element from the first cathode line.

16. The repair method of claim 15, wherein:

the cathode electrode of the second-first light-emitting element is connected to the cathode electrode of the second-second light-emitting element; and the cathode electrode of the second-first light-emitting element and the cathode electrode of the second-second light-emitting element are electrically separated from the cathode electrode of the first-first light-emitting element and the cathode electrode of the first-second light-emitting element.

17. The repair method of claim 16, wherein:

the second-first light-emitting element and the second-second light emitting element are capable of emitting light; and the first-first light-emitting element and the second-second light emitting element are each a dark point that does not emit light.

18. The repair method of claim 16, wherein:

the first-first light-emitting element, the second-first light-emitting element, and the second-second light-emitting element are capable of emitting light; and the first-second light-emitting element is a dark point that does not emit light.

19. The repair method of claim 14, further comprising electrically separating the cathode electrode of the second-first light-emitting element from the cathode electrode of the second-second light-emitting element.

20. The repair method of claim 19, wherein:

the cathode electrode of the first-second light-emitting element and the cathode electrode of the second-first light-emitting element are electrically connected; and the cathode electrode of the first-second light-emitting element and the cathode electrode of the second-first light-emitting element are electrically separated from the cathode electrode of the first-first light-emitting element and the cathode electrode of the second-second light-emitting element.

21. The repair method of claim 20, wherein:

the first-second light-emitting element and the second-first light-emitting element are capable of emitting light; and the first-first light-emitting element and the second-second light-emitting element are each a dark point that does not emit light.

22. The repair method of claim 14, wherein the first cathode line and the second cathode line are separated and insulated from each other at a portion where the first cathode line and the second cathode line do not overlap.

23. The repair method of claim 14, wherein the first cathode line and the second cathode line are connected at an overlapping portion where the first cathode line and the second cathode line overlap.

* * * * *